(12) United States Patent
Liu et al.

(10) Patent No.: US 11,290,130 B2
(45) Date of Patent: Mar. 29, 2022

(54) OPTIMIZED IMPLEMENTATION OF (DE-)INTERLEAVING AND RATE (DE-)MATCHING FOR 3GPP NEW RADIO

(71) Applicant: Telefonaktiebolaget LM Ericsson (publ), Stockholm (SE)

(72) Inventors: Qingchao Liu, Ottawa (CA); Xixian Chen, Ottawa (CA); Yashar Nezami, Ottawa (CA)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/286,110

(22) PCT Filed: Nov. 7, 2018

(86) PCT No.: PCT/IB2018/058754
§ 371 (c)(1),
(2) Date: Apr. 16, 2021

(87) PCT Pub. No.: WO2020/095093
PCT Pub. Date: May 14, 2020

(65) Prior Publication Data
US 2021/0320675 A1   Oct. 14, 2021

(51) Int. Cl.
*H03M 13/00* (2006.01)
*H03M 13/27* (2006.01)
*H03M 13/11* (2006.01)

(52) U.S. Cl.
CPC ..... *H03M 13/2707* (2013.01); *H03M 13/116* (2013.01); *H03M 13/635* (2013.01); *H03M 13/6561* (2013.01); *H03M 13/6569* (2013.01)

(58) Field of Classification Search
CPC ........... H03M 13/2707; H03M 13/116; H03M 13/635; H03M 13/6561; H03M 13/6569
See application file for complete search history.

(56) References Cited

U.S. PATENT DOCUMENTS

| 6,476,738 B1 | 11/2002 | Mitsutani |
| 8,225,168 B2 * | 7/2012 | Yu .......................... H04L 1/0057 |
| | | 714/752 |

(Continued)

FOREIGN PATENT DOCUMENTS

| EP | 1 850 486 A1 | 10/2007 |
| WO | 2006/082923 A1 | 8/2006 |
| WO | 2018/137645 A1 | 8/2018 |

OTHER PUBLICATIONS

3GPP TS 38.212 V15.0 0 (Dec. 2017) 3rd Generation Partnership Project; Technical Specification Group Radio Access Network; NR; Multiplexing and Channel Coding (Release 15).

(Continued)

*Primary Examiner* — Esaw T Abraham
(74) *Attorney, Agent, or Firm* — Christopher & Weisberg, P.A.

(57) ABSTRACT

Apparatuses and methods are disclosed for a communication device associated with a wireless transmission. In one embodiment, a method includes performing one of a low-density parity check, LDPC, decoding process and an LDPC encoding process by loading a set of bits, in parallel, into a plurality of registers, the set of bits being distributed among the plurality of registers; one of de-interleaving and interleaving the loaded set of bits within the plurality of registers by rearranging the loaded set of bits into one of a de-interleaved and an interleaved set of bits; and after the set of bits is rearranged into the one of the de-interleaved and the interleaved set of bits within the plurality of registers, writing the one of the de-interleaved and the interleaved set of bits, in parallel, from the plurality of registers to memory.

22 Claims, 12 Drawing Sheets

(56) References Cited

U.S. PATENT DOCUMENTS

| | | | |
|---|---|---|---|
| 8,281,214 B2* | 10/2012 | Yang | H03M 13/116 714/758 |
| 8,402,324 B2* | 3/2013 | Gunnam | H03M 13/116 714/701 |
| 9,032,260 B2 | 5/2015 | Petrov | |
| 9,300,517 B2* | 3/2016 | Park | H04L 1/0003 |
| 9,748,973 B2* | 8/2017 | Zhang | H03M 13/1105 |
| 9,762,264 B2 | 9/2017 | Myung et al. | |
| 9,971,684 B2* | 5/2018 | Coussy | H03M 13/2775 |
| 10,432,225 B2* | 10/2019 | Shinohara | H03M 13/118 |
| 10,447,303 B2* | 10/2019 | Young | H03M 13/1137 |
| 2014/0233681 A1* | 8/2014 | Taylor | H04L 5/0044 375/340 |
| 2015/0326351 A1* | 11/2015 | Kim | H04L 1/0071 375/219 |

OTHER PUBLICATIONS

Invitation to Pay Additional Fees and, Where Applicable, Protest Fee issued in PCT Application No. PCT/IB2018/058754, consisting of 18 pages.

International Search Report and Written Opinion dated Jul. 16, 2019 issued in PCT Application No. PCT/IB2018/058754, consisting of 22 pages.

Written Opinion of the International Preliminary Examining Authority dated Oct. 19, 2020 issued in PCT Application No. PCT/IB2018/058754, consisting of 8 pages.

Richter et al., Interleaving on Parallel DSP Architectures; Journal of VLSI Processing 39, 161-173, 2005; Springer Science Business Media, Inc., consisting of 13 pages.

Spanos et al., Reduced Complexity Rate-Matching/De-Matching Architecture for the LIE Turbo Code, The University of Edinburgh, Scotland, UK; 2014 IEEE, pp. 411-414; consisting of 4 pages.

* cited by examiner

SHUFFLING

Table 3

Table 4

FIG. 10

PERMUTING

Table 5

FIG. 11

SOFT VALUE GROUPING

|            | Lane 0 |     | Lane 1 |     | Lane 2 |     | Lane 3 |     |
|------------|--------|-----|--------|-----|--------|-----|--------|-----|
| Register 0 | B00    | B01 | B02    | B03 | B04    | B05 | B06    | B07 |
| Register 1 | B10    | B11 | B12    | B13 | B14    | B15 | B16    | B17 |
| Register 2 | B20    | B21 | B22    | B23 | B24    | B25 | B26    | B27 |
| Register 3 | B30    | B31 | B32    | B33 | B34    | B35 | B36    | B37 |
| Register 4 | B40    | B41 | B42    | B43 | B44    | B45 | B46    | B47 |
| Register 5 | B50    | B51 | B52    | B53 | B54    | B55 | B56    | B57 |
| Register 6 | B60    | B61 | B62    | B63 | B64    | B65 | B66    | B67 |
| Register 7 | B70    | B71 | B72    | B73 | B74    | B75 | B76    | B77 |

Table 6

FIG. 12

| B00 | 0 | 8 | 16 | 24 | 32 | 40 | 48 | 56 | Lane 0 |
| B01 | 1 | 9 | 17 | 25 | 33 | 41 | 49 | 57 | Lane 0 |
| B02 | 2 | 10 | 18 | 26 | 34 | 42 | 50 | 58 | Lane 1 |
| B03 | 3 | 11 | 19 | 27 | 35 | 43 | 51 | 59 | Lane 1 |
| B04 | 4 | 12 | 20 | 28 | 36 | 44 | 52 | 60 | Lane 2 |
| B05 | 5 | 13 | 21 | 29 | 37 | 45 | 53 | 61 | Lane 2 |
| B06 | 6 | 14 | 22 | 30 | 38 | 46 | 54 | 62 | Lane 3 |
| B07 | 7 | 15 | 23 | 31 | 39 | 47 | 55 | 63 | Lane 3 |

Table 7

FIG. 13

PACKING AND UNPACKING

|  | Lane 0 | | Lane 1 | | Lane 2 | | Lane 3 | |
|---|---|---|---|---|---|---|---|---|
| Register 0 | B00 | B10 | B20 | B30 | B40 | B50 | B60 | B70 |
| Register 1 | B01 | B11 | B21 | B31 | B41 | B51 | B61 | B71 |
| Register 2 | B02 | B12 | B22 | B32 | B42 | B52 | B62 | B72 |
| Register 3 | B03 | B13 | B23 | B33 | B43 | B53 | B63 | B73 |
| Register 4 | B04 | B14 | B24 | B34 | B44 | B54 | B64 | B74 |
| Register 5 | B05 | B15 | B25 | B35 | B45 | B55 | B65 | B75 |
| Register 6 | B06 | B16 | B26 | B36 | B46 | B56 | B66 | B76 |
| Register 7 | B07 | B17 | B27 | B37 | B47 | B57 | B67 | B77 |

Table 8

FIG. 14

SOFT VALUE GROUP MAPPING FOR PACKING
AND UNPACKING (REGISTER 0)

| Lane 0 | $B_{00}(0)$ | $B_{01}(0)$ |
| --- | --- | --- |
| Lane 1 | $B_{10}(0)$ | $B_{11}(0)$ |
| Lane 2 | $B_{20}(0)$ | $B_{21}(0)$ |
| Lane 3 | $B_{30}(0)$ | $B_{31}(0)$ |

Table 9

| Lane 0 | $B_{00}(1)$ | $B_{01}(1)$ |
| --- | --- | --- |
| Lane 1 | $B_{10}(1)$ | $B_{11}(1)$ |
| Lane 2 | $B_{20}(1)$ | $B_{21}(1)$ |
| Lane 3 | $B_{30}(1)$ | $B_{31}(1)$ |

Table 10

| Lane 0 | $B_{00}(0)$ | $B_{00}(1)$ |
| --- | --- | --- |
| Lane 1 | $B_{10}(0)$ | $B_{10}(1)$ |
| Lane 2 | $B_{20}(0)$ | $B_{20}(1)$ |
| Lane 3 | $B_{30}(0)$ | $B_{30}(1)$ |

Table 11

FIG. 15

| Lane 0 | $B_{01}(0)$ | $B_{01}(1)$ |
| --- | --- | --- |
| Lane 1 | $B_{11}(0)$ | $B_{11}(1)$ |
| Lane 2 | $B_{21}(0)$ | $B_{21}(1)$ |
| Lane 3 | $B_{31}(0)$ | $B_{31}(1)$ |

Table 12

OPTIMIZED IMPLEMENTATION OF (DE-)INTERLEAVING AND RATE (DE-)MATCHING FOR 3GPP NEW RADIO

CROSS-REFERENCE TO RELATED APPLICATIONS

This application is a Submission Under 35 U.S.C. § 371 for U.S. National Stage Patent Application of International Application Number: PCT/IB2018/058754, filed Nov. 7, 2018 entitled "OPTIMIZED IMPLEMENTATION OF (DE-)INTERLEAVING AND RATE (DE-) MATCHING FOR 3GPP NEW RADIO," the entirety of which is incorporated herein by reference.

TECHNICAL FIELD

Wireless communication and in particular, for algorithm optimization for de-interleaving and rate de-matching.

BACKGROUND

Low-density Parity Check (LDPC) code was first developed by Robert Gallager in 1963. Since it was too complex to be implemented at that time, LDPC was essentially forgotten until his work was rediscovered in 1996. In 2003, an irregular repeat accumulating (IRA) style LDPC code beat six turbo codes to become the error correcting code in the new Digital Video Broadcasting—Satellite—Second Generation (DVB-S2) standard for satellite transmissions. In 2008, LDPC beat convolutional turbo codes as the forward error correction (FEC) system for the International Telecommunication Union (ITU-T) G.hn standard. LDPC codes are also used for 10GBase-T Ethernet, which sends data at 10 gigabits per second over twisted-pair cables. As of 2009, LDPC codes are also part of the Wi-Fi 802.11 standard as an optional part of 802.11n and 802.11ac, in the High Throughput (HT) PHY specification. In December 2017, LDPC was adopted by $3^{rd}$ Generation Partnership Project (3GPP) for traffic channels in the $5^{th}$ Generation (5G) New Radio (NR) standard.

FIG. 1 shows a diagram for example LDPC encoding and decoding process chains, which may be part of a Layer 1 (L1) downlink (DL) in the 5G NR standard. For a DL transmitter, the information bits plus the transport block (TB) Cyclic Redundancy Check (CRC) can form a TB at Medium Access Control (MAC) layer. As shown in FIG. 1, the TB is then passed to the physical layer for further processing, such as for example, the encoding process chain in L1. As part of the encoding process chain, the TB may be divided into smaller size code blocks, which may be referred to as code block (CB) segmentation. After the CB segmentation and attaching a CB CRC, each CB may be encoded using, for example, an LDPC coding scheme. After the LDPC encoding, rate matching and interleaving may be performed, as well as, CB concatenation, and scrambling. The output may then be modulated using either Quadrature Phase Shift Keying (QPSK), 16 Quadrature Amplitude Modulation (16 QAM), 64 QAM, or 256 QAM. After layer mapping, precoding, resource mapping, Orthogonal Frequency Division Multiplexing (OFDM) signal generation, the output is sent to the air through the radio.

A receiver may receive the output signal. The receiver processing chain may be generally considered the reverse of the transmitter processing chain. In 5G, the slot time duration is much shorter than the slot time durations for other standards, such as Long Term Evolution (LTE). For example, for LTE, the slot duration is 1 millisecond (ms); however, for 5G, the slot time duration may be as short as 125 microseconds (μs). Thus, signal processing techniques should be developed to support shorter slot time durations, such as those of 5G NR.

SUMMARY

Some embodiments advantageously provide methods and apparatuses for de-interleaving and rate de-matching, as well as, interleaving and rate matching, that may provide for faster processing of radio signals.

According to a first aspect, a method is provided for a communication device associated with a wireless transmission. The method includes performing one of a low-density parity check, LDPC, decoding process and an LDPC encoding process. The one of the LDPC decoding process and the LDPC encoding process includes loading a set of bits, in parallel, into a plurality of registers, the set of bits being distributed among the plurality of registers; one of de-interleaving and interleaving the loaded set of bits within the plurality of registers by rearranging the loaded set of bits into one of a de-interleaved and an interleaved set of bits; and after the set of bits is rearranged into the one of the de-interleaved and the interleaved set of bits within the plurality of registers, writing the one of the de-interleaved and the interleaved set of bits, in parallel, from the plurality of registers to memory.

According to this aspect, for the de-interleaving operation, the set of bits includes a set of encoded soft bits. For the interleaving operation, the set of bits includes a set of encoded bits. In some embodiments of this aspect, each of the plurality of registers is part of processor register architecture of at least one processor performing the one of the LDPC decoding process and the LDPC encoding process; and the memory is external to the at least one processor and separated by the at least one processor via at least one bus. In some embodiments of this aspect, the one of the de-interleaving and interleaving the set of bits within the plurality of registers further comprises one of de-interleaving and interleaving the set of bits within the plurality of registers by rearranging the set of bits into the one of the de-interleaved and the interleaved set of bits without accessing the memory, performing the one of the de-interleaving and the interleaving using the plurality of registers without accessing the memory being faster than performing the one of the de-interleaving and the interleaving using the memory. In some embodiments of this aspect, if the one of the de-interleaving and interleaving is de-interleaving, the set of bits includes a set of soft bits, the set of soft bits corresponding to a plurality of soft values, each of the plurality of soft values corresponding to an LDPC probability value. In some embodiments of this aspect, the de-interleaving the set of bits within the plurality of registers includes shuffling soft bits in the set of bits; permuting the shuffled soft bits; and performing packing and unpacking on the shuffled, permuted soft bits to produce the de-interleaved set of bits. In some embodiments of this aspect, the de-interleaving the set of bits within the plurality of registers includes: within each register of the plurality of registers: shuffling soft bits of the set of bits without crossing lanes of the register; and permuting the shuffled soft bits across the lanes of the register; and within the plurality of registers, performing packing and unpacking on the shuffled, permuted soft bits to produce the de-interleaved set of bits without accessing the memory. In some embodiments of this aspect, the interleaving the set of bits within the plurality of registers includes performing packing and unpacking on bits of the set of bits within the plurality of registers; permuting the packed and unpacked bits within each register of the plurality of registers; and shuffling the permuted, packed and unpacked bits within each register of the plurality of registers to produce the interleaved set of bits without accessing the memory. In some embodiments of this aspect, the one of the de-interleaved and the interleaved set of bits produced by the rearrangement of the set of bits within the plurality of registers represents a transpose matrix of a matrix associated with the loaded set of bits. In some embodiments of this aspect, the writing the one of the de-interleaved and the interleaved set of bits, in parallel, from the plurality of registers to the memory includes storing the one of the de-interleaved and the interleaved set of bits in the memory at memory addresses determined by at least calculating a base address plus an offset, the offset based at least in part on a rate matching output bit sequence length and a modulation order for a code block of the wireless transmission.

According to a second aspect, a communication device associated with a wireless transmission is provided. The communication device includes at least one processor having a plurality of registers, the at least one processor in communication with memory. The at least one processor is configured to perform one of a low-density parity check, LDPC, decoding process and an LDPC encoding process, the one of the LDPC decoding process and the LDPC encoding process including loading a set of bits, in parallel, into a plurality of registers, the set of bits being distributed among the plurality of registers; one of de-interleaving and interleaving the loaded set of bits within the plurality of registers by rearranging the loaded set of bits into one of a de-interleaved and an interleaved set of bits; and after the set of bits is rearranged into the one of the de-interleaved and the interleaved set of bits within the plurality of registers, writing the one of the de-interleaved and the interleaved set of bits, in parallel, from the plurality of registers to memory.

The processor is further configured to perform all the functionalities and methods described herein and all the embodiments described in the first aspect, for example.

According to a third aspect, a method is provided for a communication device associated with a wireless communication. The method includes performing one of rate de-matching and rate matching a sequence of bits for a code block associated with a wireless communication by at least iteratively processing bits of the sequence of bits, and for each iteration, before processing the bits, pre-calculating a starting position value and a bit processing number, the starting position value representing a starting bit of the bits to be processed in the respective iteration, and the bit processing number representing a total number of bits to be processed in the respective iteration.

In some embodiments of this aspect, if the one of the rate de-matching and the rate matching is rate de-matching, the sequence of bits includes encoded soft bits. In some embodiments of this aspect, if the one of the rate de-matching and the rate matching is rate matching, the sequence of bits includes encoded bits. In some embodiments of this aspect, the one of the rate de-matching and rate matching is performed by at least one processor of the communication device without performing any division operations. In some embodiments of this aspect, the one of the rate de-matching and rate matching is performed by at least one processor of the communication device without performing any modulus operations. In some embodiments of this aspect, the pre-calculation of the starting position value and the bit processing number for each of iteration allows the at least one processor to perform the one of the rate de-matching and rate matching without performing any division operations. In some embodiments of this aspect, the one of the rate de-matching and rate matching is performed in at least one of a low density parity check, LDPC, processing chain and a polar processing chain. In some embodiments of this aspect, for the rate matching, the iteratively processing the bits of the sequence of bits comprises at least one of repeating and puncturing the bits to match a total number of bits associated with resources assigned for the wireless communication; and for the rate de-matching, the iteratively processing the bits of the sequence of bits comprises combining the bits to produce a rate de-matched soft bit sequence. In some embodiments of this aspect, the pre-calculating the starting position value and the bit processing number is based at least in part on: a length of the code block, a total number of bits to be processed for the one of rate de-matching and rate matching the sequence of bits for the code block, and a start position of a circular buffer, the start position being determined at least in part by a redundancy version of the wireless communication. In some embodiments of this aspect, the pre-calculating the starting position value and the bit processing number comprises determining the bit processing number based at least in part on: the starting position value of the respective iteration, a length of the code block, a total number of bits to be processed for the one of rate de-matching and rate matching the sequence of bits for the code block, and a start position of a circular buffer, the start position being determined at least in part by a redundancy version of the wireless communication.

According to a fourth aspect, a communication device associated with a wireless communication is provided. The communication device includes at least one processor, the at least one processor in communication with memory, the at least one processor configured with machine instructions to: perform one of rate de-matching and rate matching a sequence of bits for a code block associated with a wireless communication by at least iteratively processing bits of the sequence of bits, and for each iteration, before processing the bits, pre-calculate a starting position value and a bit processing number, the starting position value representing a starting bit of the bits to be processed in the respective iteration, and the bit processing number representing a total number of bits to be processed in the respective iteration.

The processor is further configured to perform all the methods and functionalities described herein and the embodiments of the third aspect, for example.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein:

FIG. 10 illustrates shuffling according to some embodiments of this disclosure with tables;

FIG. 11 illustrates permuting according to some embodiments of this disclosure with a table;

FIG. 12 illustrates soft value grouping according to some embodiments of this disclosure with a table;

FIG. 13 illustrates soft value grouping according to some embodiments of this disclosure with a table;

FIG. 14 illustrates packing and unpacking according to some embodiments of this disclosure;

FIG. 15 illustrates soft value group mapping for packing and unpacking for register 0 according to one example in this disclosure, with tables; and FIG. 16 illustrates packing and unpacking for register 1 according to one example in this disclosure, with tables.

DETAILED DESCRIPTION

Figure 1:
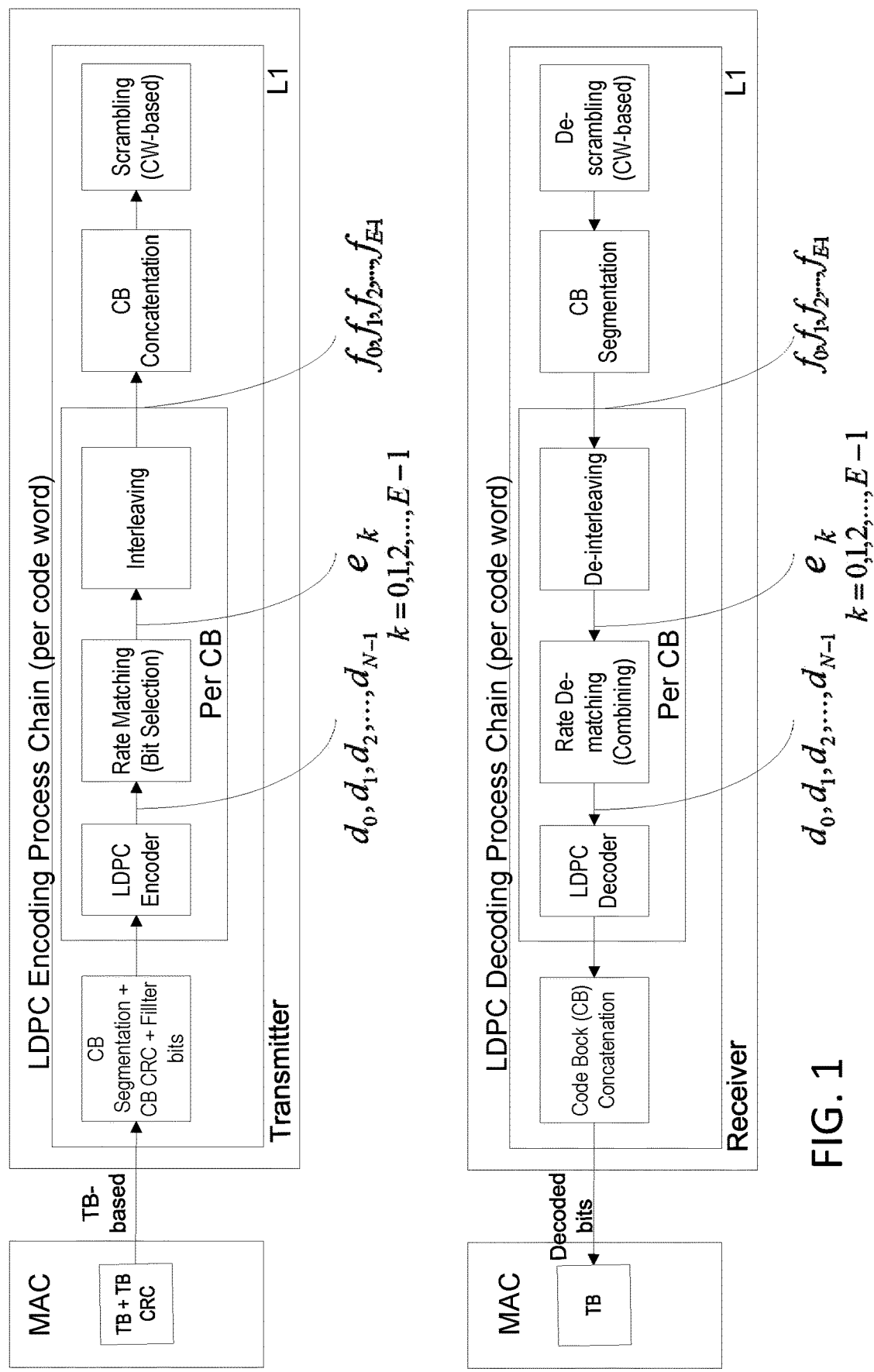
FIG. 1 is a block diagram for example LDPC encoding and decoding process chains as part of a L1 DL communication.

5G NR has unique requirements that may benefit from the techniques disclosed herein for faster processing of signals, as compared to existing techniques. For example, 5G NR has requirements for supporting incremental redundancy via Hybrid Automatic Repeat request (HARQ). In addition to this, rate matching should be supported to dynamically adjust the coding rate to the allocated resources.

The rate matching for an LDPC code may be defined per coded block (CB) and may include at least a bit selection and bit interleaving process. The input bit sequence to rate matching may be denoted by $d_0, d_1, d_2, \ldots, d_{N-1}$. The output bit sequence after rate matching may be denoted as $f_0, f_1, f_2, \ldots, f_{E-1}$.

Bit Selection

The bit sequence after encoding $d_0, d_1, d_2, \ldots, d_{N-1}$ may be written into a circular buffer of length N for the $r$-th coded block, where N is the total number of bits after encoding per code block. The start position and the total number of output bits after rate matching may be determined by the redundancy version, modulation order, number of layers, TB size, and/or the total number of coded bits available for transmission of the TB.

The start bit position may be denoted as k0 and may be determined by the redundancy version. Furthermore, Ncb may denote the CB length. Thus, for a transmitter, the pseudo code for generating the rate matching output bit sequence $e_k$, k=0,1,2, . . . E−1, may be as follows:

```
int k =0;
int j = 0;
while(k < E) {
    if(d[(k0+j) % Ncb] != Null) {
        e[k] = d[(k0+j) % Ncb];
        k++;          }
    j++;    }
```

On the receiver-side, the pseudo code for rate de-matching at the receiver may be as follows:

```
int k =0;
int j = 0;
while(k < E) {
    d[(k0+j) % Ncb]+=e[k];
    k++;
    j++;    }
```

Unfortunately, because the modulo operation is required for calculating each output value in this pseudo-code, this algorithm may not be efficient. For example, performing the modulo operation requires a division operation, which can require much more processing cycles to compute than other mathematic operations.

Bit Interleaving The bit sequence $e_0, e_1, e_2, \ldots, e_{E-1}$ may be interleaved to bit sequence $f_0, f_1, f_2, \ldots, f_{E-1}$, according to the following pseudo code, where the value of Q may be given by the table below, Table 1:

```
for j = 0 to E / Q − 1
    for i = 0 to Q − 1
        f_{i+j·Q} = e_{i·E/Q+j};
    end for
end for.
```

TABLE 1

Modulation and number of coded bits per QAM symbol

| Modulation | Q |
|---|---|
| π/2 − BPSK, BPSK | 1 |
| QPSK | 2 |
| 16QAM | 4 |
| 64QAM | 6 |
| 256QAM | 8 |

This algorithm may also not be efficient because each output bit is calculated sequentially instead of in parallel. Thus, some embodiments of this disclosure provide for a more efficient algorithm to implement de-interleaving and rate de-matching operations in a decoding process chain, such as, for example, an LDPC decoding process chain, as well as, interleaving and rate matching operations. For example, for a de-interleaving operation vector-based parallelization may be used. In such embodiments, each operation may include, for example, 8×64 bytes which is supper fast, compared to existing algorithms. Both memory read and write operations may be performed in parallel (bulk operation). In some embodiments, each read/write operation may include 2×64 bytes' memory read/write. Some embodiments of this disclosure for de-interleaving may include the following steps: loading soft values in parallel into 8 registers; shuffling soft values per register lane; permuting/permutating per register; unpacking and packing; and storing the result in parallel.

In other embodiments of this disclosure, for a rate matching operation, modular operation may not be used and, instead, bulk reads and writes may be used with pre-calculating the start and wraparound positions.

Advantageously, some embodiments of this disclosure provide for one or more of the following:

Less Central Processing Unit (CPU) cycles: In some embodiments, the techniques disclosed herein have resulted in deinterleaving and rate de-matching that is 40 times faster than the existing solutions for deinterleaving and rate de-matching operations in an LDPC decoding process chain at the receiver. The CPU cycles saving is particular useful for 5G, since the slot time duration is much shorter than LTE. For LTE, the slot duration is 1 ms. However, for 5G, the slot duration can be as short as 125 µs.

For deinterleaving operation, vector-based parallelization where each operation includes 8×64 bytes may be considered to be super-fast compared to existing deinterleaving operations.

Both memory read and writes may be performed in parallel (bulk operation) such that each operation includes 2×64 bytes' memory read or write.

Before describing in detail exemplary embodiments, it is noted that the embodiments reside primarily in combinations of apparatus components and processing steps related to algorithm optimization for de-interleaving/interleaving and rate de-matching/matching. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein.

As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

In embodiments described herein, the joining term, "in communication with" and the like, may be used to indicate electrical or data communication, which may be accomplished by physical contact, induction, electromagnetic radiation, radio signaling, infrared signaling or optical signaling, for example. One having ordinary skill in the art will appreciate that multiple components may interoperate and modifications and variations are possible of achieving the electrical and data communication. In some embodiments described herein, the term "coupled," "connected," and the like, may be used herein to indicate a connection, although not necessarily directly, and may include wired and/or wireless connections.

The term "network node" used herein can be any kind of network node comprised in a radio network which may further comprise any of base station (BS), radio base station, base transceiver station (BTS), base station controller (BSC), radio network controller (RNC), g Node B (gNB), evolved Node B (eNB or eNodeB), Node B, multi-standard radio (MSR) radio node such as MSR BS, multi-cell/multicast coordination entity (MCE), relay node, donor node controlling relay, radio access point (AP), transmission points, transmission nodes, Remote Radio Unit (RRU) Remote Radio Head (RRH), a core network node (e.g., mobile management entity (MME), self-organizing network (SON) node, a coordinating node, positioning node, MDT node, etc.), an external node (e.g., 3rd party node, a node external to the current network), nodes in distributed antenna system (DAS), a spectrum access system (SAS) node, an element management system (EMS), etc. The network node may also comprise test equipment. The term "radio node" used herein may be used to also denote a wireless device (WD) such as a wireless device (WD) or a radio network node.

In some embodiments, the non-limiting terms wireless device (WD) or a user equipment (UE) are used interchangeably. The WD herein can be any type of wireless device capable of communicating with a network node or another WD over radio signals, such as wireless device (WD). The WD may also be a radio communication device, target device, device to device (D2D) WD, machine type WD or WD capable of machine to machine communication (M2M), low-cost and/or low-complexity WD, a sensor equipped with WD, Tablet, mobile terminals, smart phone, laptop embedded equipped (LEE), laptop mounted equipment (LME), USB dongles, Customer Premises Equipment (CPE), an Internet of Things (IoT) device, or a Narrowband IoT (NB-IOT) device etc.

In some embodiments, the term "communication device" is used herein broadly to refer to any communication device capable of communication with another communication device over radio signals. Examples of a communication device include, for example, WD, UE, network node, and/or base station. In some embodiments, the communication device may be and/or include a transmitter configured to process and transmit a radio signal, such as, a DL communication. In some embodiments, the communication device may be and/or include a receiver configured to receive and process the radio signal, such as, the DL communication, e.g., according to the techniques in this disclosure.

Also, in some embodiments the generic term "radio network node" is used. It can be any kind of a radio network node which may comprise any of base station, radio base station, base transceiver station, base station controller, network controller, RNC, evolved Node B (eNB), Node B, gNB, Multi-cell/multicast Coordination Entity (MCE), relay node, access point, radio access point, Remote Radio Unit (RRU) Remote Radio Head (RRH).

As used herein, in some embodiments, the terms "soft value" and "soft bit" are used interchangeably to indicate a probability value, such as an LDPC probability value. In some embodiments, the "soft value" and/or "soft bit" may be represented by 8 binary digits (bits). In other embodiments, the "soft value" and/or "soft bit" may be represented by more or less than 8 binary digits/bits. In some embodiments, the "soft value" and/ or "soft bit" may be considered a soft metric that may be taken, for example, at the output of a demodulator of a receiver (e.g., WD) and may provide an indication of the information being received, as well as, a probability associated with the information. For example, a received radio signal may be converted into soft bits based on log-likelihood estimates, which are known in the signal processing arts.

As used herein, in some embodiments, the term "machine instructions" is used. In some embodiments, the term "machine instructions" means machine language instructions that can be directly executed by a processor, such as central processing unit (CPU). For example, the machine instructions may be part of a machine instruction set for a particular type of processor and each machine instruction may cause the processor or CPU to perform a very specific task, such as, a load, a jump, an arithmetic operation (e.g., add, subtract, divide, etc.) by an arithmetic logic unit in the processor or CPU using register(s), etc. In some embodiments, the machine code may be for example assembly language or compiled code. In some embodiments, the machine code may be considered executable machine code. In some embodiments, the machine instructions according to this disclosure are intended to restrict certain operations to performance within the registers, without accessing memory, and/or to eliminate costly operations, such as modulus and/or division operations to enable fast processing times required by some emerging network technologies, such as for example New Radio.

Note that although terminology from one particular wireless system, such as, for example, 3GPP LTE and/or New Radio (NR), may be used in this disclosure, this should not be seen as limiting the scope of the disclosure to only the aforementioned system. Other wireless systems, including without limitation Wide Band Code Division Multiple Access (WCDMA), Worldwide Interoperability for Microwave Access (WiMax), Ultra Mobile Broadband (UMB) and Global System for Mobile Communications (GSM), may also benefit from exploiting the ideas covered within this disclosure. Note further, that functions described herein as being performed by a wireless device or a network node may be distributed over a plurality of wireless devices and/or network nodes. In other words, it is contemplated that the functions of the network node and wireless device described herein are not limited to performance by a single physical device and, in fact, can be distributed among several physical devices.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
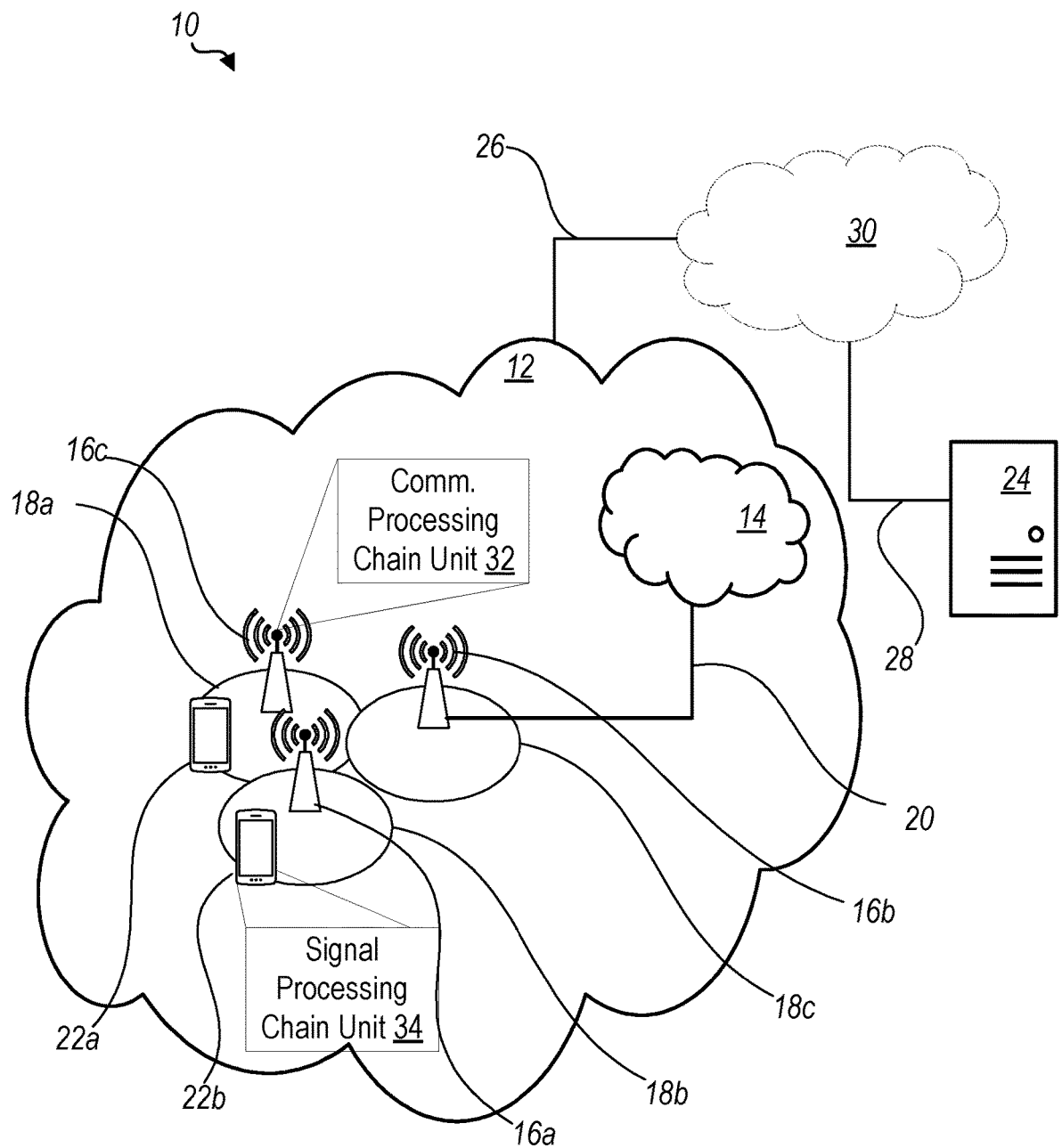
FIG. 2 is a schematic diagram of an exemplary network architecture illustrating a communication system connected via an intermediate network to a host computer according to the principles in the present disclosure.

Referring again to the drawing figures, in which like elements are referred to by like reference numerals, there is shown in FIG. 2 a schematic diagram of a communication system 10, according to an embodiment, such as a 3GPP-type cellular network that may support standards such as LTE and/or NR (5G), which comprises an access network 12, such as a radio access network, and a core network 14. The access network 12 comprises a plurality of network nodes 16a, 16b, 16c (referred to collectively as network nodes 16), such as NBs, eNBs, gNBs or other types of wireless access points, each defining a corresponding coverage area 18a, 18b, 18c (referred to collectively as coverage areas 18). Each network node 16a, 16b, 16c is connectable to the core network 14 over a wired or wireless connection 20. A first wireless device (WD) 22a located in coverage area 18a is configured to wirelessly connect to, or be paged by, the corresponding network node 16c. A second WD 22b in coverage area 18b is wirelessly connectable to the corresponding network node 16a. While a plurality of WDs 22a, 22b (collectively referred to as wireless devices 22) are illustrated in this example, the disclosed embodiments are equally applicable to a situation where a sole WD is in the coverage area or where a sole WD is connecting to the corresponding network node 16. Note that although only two WDs 22 and three network nodes 16 are shown for convenience, the communication system may include many more WDs 22 and network nodes 16.

Also, it is contemplated that a WD 22 can be in simultaneous communication and/or configured to separately communicate with more than one network node 16 and more than one type of network node 16. For example, a WD 22 can have dual connectivity with a network node 16 that supports LTE and the same or a different network node 16 that supports NR. As an example, WD 22 can be in communication with an eNB for LTE/E-UTRAN and a gNB for NR/NG-RAN.

The communication system 10 may itself be connected to a host computer 24, which may be embodied in the hardware and/or software of a standalone server, a cloud-implemented server, a distributed server or as processing resources in a server farm. The host computer 24 may be under the ownership or control of a service provider, or may be operated by the service provider or on behalf of the service provider. The connections 26, 28 between the communication system 10 and the host computer 24 may extend directly from the core network 14 to the host computer 24 or may extend via an optional intermediate network 30. The intermediate network 30 may be one of, or a combination of more than one of, a public, private or hosted network. The intermediate network 30, if any, may be a backbone network or the Internet. In some embodiments, the intermediate network 30 may comprise two or more sub-networks (not shown).

The communication system of FIG. 2 as a whole enables connectivity between one of the connected WDs 22a, 22b and the host computer 24. The connectivity may be described as an over-the-top (OTT) connection. The host computer 24 and the connected WDs 22a, 22b are configured to communicate data and/or signaling via the OTT connection, using the access network 12, the core network 14, any intermediate network 30 and possible further infrastructure (not shown) as intermediaries. The OTT connection may be transparent in the sense that at least some of the participating communication devices through which the OTT connection passes are unaware of routing of uplink and downlink communications. For example, a network node 16 may not or need not be informed about the past routing of an incoming downlink communication with data originating from a host computer 24 to be forwarded (e.g., handed over) to a connected WD 22a. Similarly, the network node 16 need not be aware of the future routing of an outgoing uplink communication originating from the WD 22a towards the host computer 24.

A communication device, which may be a network node 16 or a wireless device 22, is configured to include a communication processing chain unit 32 which is configured to perform one of a low-density parity check, LDPC, decoding process and an LDPC encoding process, the one of the LDPC decoding process and the LDPC encoding process including loading a set of bits, in parallel, into a plurality of registers, the set of bits being distributed among the plurality of registers; one of de-interleaving and interleaving the loaded set of bits within the plurality of registers by rearranging the loaded set of bits into one of a de-interleaved and an interleaved set of bits; and after the set of bits is rearranged into the one of the de-interleaved and the interleaved set of bits within the plurality of registers, writing the one of the de-interleaved and the interleaved set of bits, in parallel, from the plurality of registers to memory.

A communication device, which may be a network node 16 or a wireless device 22, is configured to include a signal processing chain unit 34 which is configured to perform one of rate de-matching and rate matching a sequence of bits for a code block associated with a wireless communication by at least iteratively processing bits of the sequence of bits, and for each iteration, before processing the bits, pre-calculate a starting position value and a bit processing number, the starting position value representing a starting bit of the bits to be processed in the respective iteration, and the bit processing number representing a total number of bits to be processed in the respective iteration.

Figure 3:
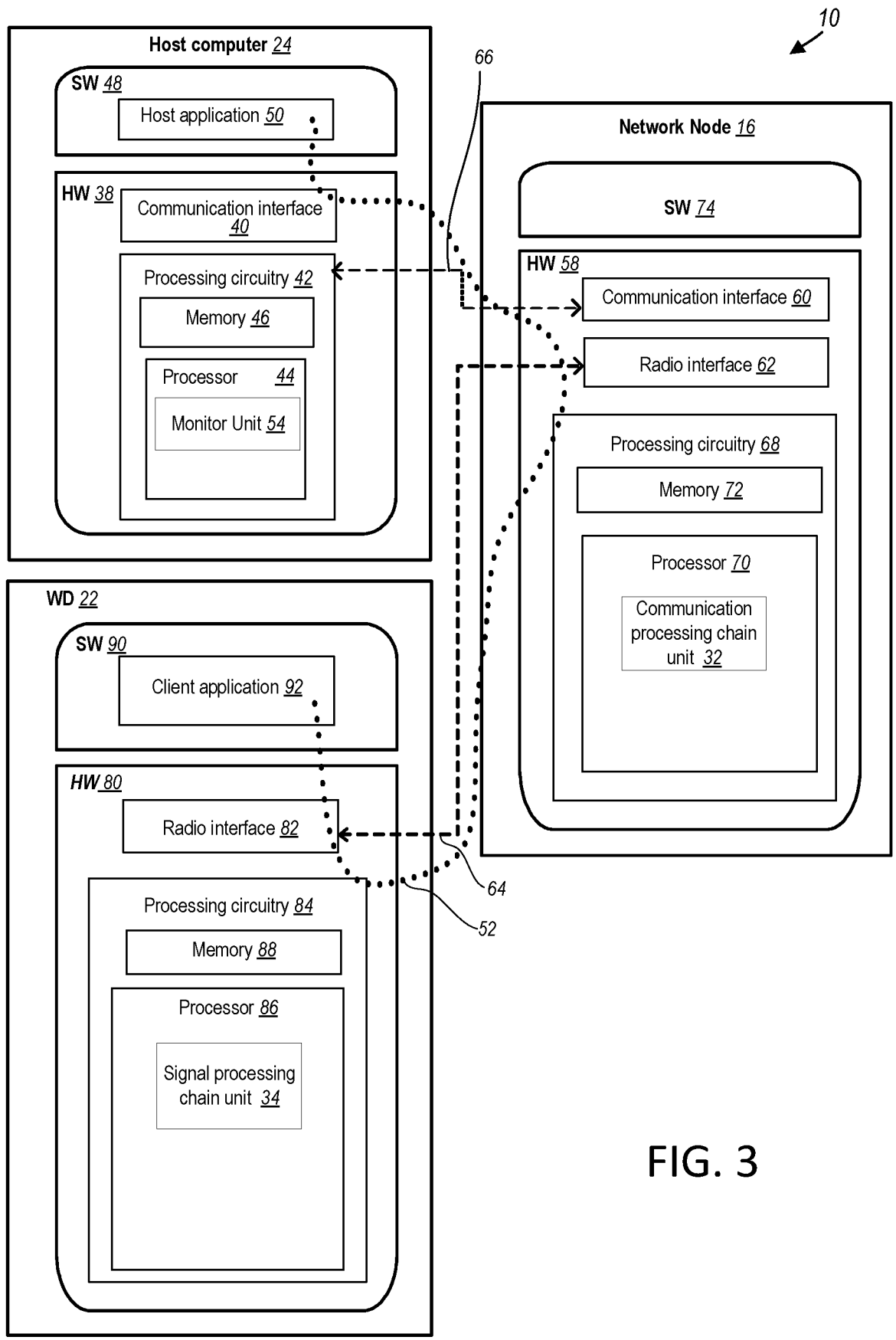
FIG. 3 is a block diagram of a host computer communicating via a network node with a wireless device over an at least partially wireless connection according to some embodiments of the present disclosure.

Although, in some embodiments, the description discusses rate matching and rate de-matching with respect to the signal processing chain unit 34 shown in the example in the WD 22, it should be understood the rate matching and rate de-matching according to the techniques in this disclosure may also be performed by the communication processing chain unit 32 shown in the example in the network node 16. Similarly, some embodiments, the description discusses interleaving and de-interleaving with respect to the communication processing chain unit 32 shown in the example in the network node 16, it should be understood the interleaving and de-interleaving according to the techniques in this disclosure may also be performed by the signal processing chain unit 34 shown in the example in the WD 22. Stated another way, the architecture depicted in FIGS. 2 and 3 are intended as an example and should not been seen as limiting this disclosure to the particular devices and network structure shown and can be used, in some embodiments, with any radio device capable of performing the processing techniques described herein.

Example implementations, in accordance with an embodiment, of the WD 22, network node 16 and host computer 24 discussed in the preceding paragraphs will now be described with reference to FIG. 3. In a communication system 10, a host computer 24 comprises hardware (HW) 38 including a communication interface 40 configured to set up and maintain a wired or wireless connection with an interface of a different communication device of the communication system 10. The host computer 24 further comprises processing circuitry 42, which may have storage and/or processing capabilities. The processing circuitry 42 may include a processor 44 and memory 46. In particular, in addition to or instead of a processor, such as a central processing unit, and memory, the processing circuitry 42 may comprise integrated circuitry for processing and/or control, e.g., one or more processors and/or processor cores and/or FPGAs (Field Programmable Gate Array) and/or ASICs (Application Specific Integrated Circuitry) adapted to execute instructions. The processor 44 may be configured to access (e.g., write to and/or read from) memory 46, which may comprise any kind of volatile and/or nonvolatile memory, e.g., cache and/or buffer memory and/or RAM (Random Access Memory) and/or ROM (Read-Only Memory) and/or optical memory and/or EPROM (Erasable Programmable Read-Only Memory).

Processing circuitry 42 may be configured to control any of the methods and/or processes described herein and/or to cause such methods, and/or processes to be performed, e.g., by host computer 24. Processor 44 corresponds to one or more processors 44 for performing host computer 24 functions described herein. The host computer 24 includes memory 46 that is configured to store data, programmatic software code and/or other information described herein. In some embodiments, the software 48 and/or the host application 50 may include instructions that, when executed by the processor 44 and/or processing circuitry 42, causes the processor 44 and/or processing circuitry 42 to perform the processes described herein with respect to host computer 24. The instructions may be software associated with the host computer 24.

The software 48 may be executable by the processing circuitry 42. The software 48 includes a host application 50. The host application 50 may be operable to provide a service to a remote user, such as a WD 22 connecting via an OTT connection 52 terminating at the WD 22 and the host computer 24. In providing the service to the remote user, the host application 50 may provide user data which is transmitted using the OTT connection 52. The "user data" may be data and information described herein as implementing the described functionality. In one embodiment, the host computer 24 may be configured for providing control and functionality to a service provider and may be operated by the service provider or on behalf of the service provider. The processing circuitry 42 of the host computer 24 may enable the host computer 24 to observe, monitor, control, transmit to and/or receive from the network node 16 and/or the wireless device 22. The processing circuitry 42 of the host computer 24 may include a monitor unit 54 configured to enable the service provider to observe, monitor, control, transmit to and/or receive from the network node 16 and/or the wireless device 22.

The communication system 10 further includes a network node 16 provided in a communication system 10 and including hardware 58 enabling it to communicate with the host computer 24 and with the WD 22. The hardware 58 may include a communication interface 60 for setting up and maintaining a wired or wireless connection with an interface of a different communication device of the communication system 10, as well as a radio interface 62 for setting up and maintaining at least a wireless connection 64 with a WD 22 located in a coverage area 18 served by the network node 16. The radio interface 62 may be formed as or may include, for example, one or more RF transmitters, one or more RF receivers, and/or one or more RF transceivers. The communication interface 60 may be configured to facilitate a connection 66 to the host computer 24. The connection 66 may be direct or it may pass through a core network 14 of the communication system 10 and/or through one or more intermediate networks 30 outside the communication system 10.

In the embodiment shown, the hardware 58 of the network node 16 further includes processing circuitry 68. The processing circuitry 68 may include a processor 70 and a memory 72, which may, in some embodiments be separated by a bus. In particular, in addition to or instead of a processor, such as a central processing unit, and memory, the processing circuitry 68 may comprise integrated circuitry for processing and/or control, e.g., one or more processors and/or processor cores and/or FPGAs (Field Programmable Gate Array) and/or ASICs (Application Specific Integrated Circuitry) adapted to execute instructions. The processor 70 may be configured to access (e.g., write to and/or read from)

the memory 72, which may comprise any kind of volatile and/or nonvolatile memory, e.g., cache and/or buffer memory and/or RAM (Random Access Memory) and/or ROM (Read-Only Memory) and/or optical memory and/or EPROM (Erasable Programmable Read-Only Memory).

Thus, the network node 16 further has software 74 stored internally in, for example, memory 72, or stored in external memory (e.g., database, storage array, network storage device, etc.) accessible by the network node 16 via an external connection. The software 74 may be executable by the processing circuitry 68. The processing circuitry 68 may be configured to control any of the methods and/or processes described herein and/or to cause such methods, and/or processes to be performed, e.g., by network node 16. Processor 70 corresponds to one or more processors 70 for performing network node 16 functions described herein. The memory 72 is configured to store data, programmatic software code and/or other information described herein. In some embodiments, the software 74 may include instructions that, when executed by the processor 70 and/or processing circuitry 68, causes the processor 70 and/or processing circuitry 68 to perform the processes described herein with respect to network node 16. For example, processing circuitry 68 of the network node 16 may include communication processing chain unit 32. The communication processing chain unit 32 may be and/or may be located at and/or implemented in at least one processor (e.g., processor 70) having a plurality of registers, the at least one processor 70 in communication with memory (e.g., memory 72). The at least one processor 70 and/or communication processing chain unit 32 is configured to perform one of a low-density parity check, LDPC, decoding process and an LDPC encoding process, the one of the LDPC decoding process and the LDPC encoding process including loading a set of bits, in parallel, into a plurality of registers, the set of bits being distributed among the plurality of registers; one of de-interleaving and interleaving the loaded set of bits within the plurality of registers by rearranging the loaded set of bits into one of a de-interleaved and an interleaved set of bits; and after the set of bits is rearranged into the one of the de-interleaved and the interleaved set of bits within the plurality of registers, writing the one of the de-interleaved and the interleaved set of bits, in parallel, from the plurality of registers to memory.

In some embodiments, if the one of the de-interleaving and interleaving is de-interleaving, the set of bits includes a set of encoded soft bits. In some embodiments, if the one of the de-interleaving and interleaving is interleaving, the set of bits includes a set of encoded bits. In some embodiments, each of the plurality of registers is part of processor register architecture of at least one processor 70 performing the one of the LDPC decoding process and the LDPC encoding process; and the memory 72 is external to the at least one processor 70 and separated by the at least one processor 70 via at least one bus. In some embodiments, the at least one processor 70 is configured to one of de-interleave and interleave the set of bits within the plurality of registers by being configured to rearrange the set of bits into the one of the de-interleaved and the interleaved set of bits without accessing the memory 72, the one of the de-interleaving and the interleaving using the plurality of registers without accessing the memory 72 being faster than the one of the de-interleaving and the interleaving using the memory 72. In some embodiments, if the one of the de-interleaving and interleaving is de-interleaving, the set of bits includes a set of soft bits, the set of soft bits corresponding to a plurality of soft values, each of the plurality of soft values corresponding to an LDPC probability value. In some embodiments, the at least one processor 70 is further configured with machine instructions to de-interleave the set of bits within the plurality of registers by shuffling soft bits in the set of bits; permuting the shuffled soft bits; and performing packing and unpacking on the shuffled, permuted soft bits to produce the de-interleaved set of bits. In some embodiments, the at least one processor 70 is further configured with machine instructions to de-interleave the set of bits within the plurality of registers by: within each register of the plurality of registers: shuffling soft bits of the set of bits without crossing lanes of the register; and permuting the shuffled soft bits across the lanes of the register; and within the plurality of registers, performing packing and unpacking on the shuffled, permuted soft bits to produce the de-interleaved set of bits without accessing the memory 72. In some embodiments, the at least one processor 70 is further configured with machine instructions to interleave the set of bits within the plurality of registers by: performing packing and unpacking on bits of the set of bits within the plurality of registers; permuting the packed and unpacked bits within each register of the plurality of registers; and shuffling the permuted, packed and unpacked bits within each register of the plurality of registers to produce the interleaved set of bits without accessing the memory 72. In some embodiments, the one of the de-interleaved and the interleaved set of bits produced by the rearrangement of the set of bits within the plurality of registers represents a transpose matrix of a matrix associated with the loaded set of bits. In some embodiments, wherein the at least one processor 70 is further configured with machine instructions to write the one of the de-interleaved and the interleaved set of bits, in parallel, from the plurality of registers to the memory 72 by storing the one of the de-interleaved and the interleaved set of bits in the memory 72 at memory addresses determined by at least calculating a base address plus an offset, the offset based at least in part on a rate matching output bit sequence length and a modulation order for a code block of the wireless transmission.

In some embodiments, the embodiments herein described as being implemented by the network node 16, in combination with processor 70 and memory 72 of the network node 16 may be implemented by the wireless device 22 for interleaving and de-interleaving by the processor 86 and memory 88 at the wireless device 22.

The communication system 10 further includes the WD 22 already referred to. The WD 22 may have hardware 80 that may include a radio interface 82 configured to set up and maintain a wireless connection 64 with a network node 16 serving a coverage area 18 in which the WD 22 is currently located. The radio interface 82 may be formed as or may include, for example, one or more RF transmitters, one or more RF receivers, and/or one or more RF transceivers.

The hardware 80 of the WD 22 further includes processing circuitry 84. The processing circuitry 84 may include a processor 86 and memory 88, which may be separated via, for example, a bus. In particular, in addition to or instead of a processor, such as a central processing unit, and memory, the processing circuitry 84 may comprise integrated circuitry for processing and/or control, e.g., one or more processors and/or processor cores and/or FPGAs (Field Programmable Gate Array) and/or ASICs (Application Specific Integrated Circuitry) adapted to execute instructions. The processor 86 may be configured to access (e.g., write to and/or read from) memory 88, which may comprise any kind of volatile and/or nonvolatile memory, e.g., cache and/or buffer memory and/or RAM (Random Access Memory)

and/or ROM (Read-Only Memory) and/or optical memory and/or EPROM (Erasable Programmable Read-Only Memory).

Thus, the WD 22 may further comprise software 90, which is stored in, for example, memory 88 at the WD 22, or stored in external memory (e.g., database, storage array, network storage device, etc.) accessible by the WD 22. The software 90 may be executable by the processing circuitry 84. The software 90 may include a client application 92. The client application 92 may be operable to provide a service to a human or non-human user via the WD 22, with the support of the host computer 24. In the host computer 24, an executing host application 50 may communicate with the executing client application 92 via the OTT connection 52 terminating at the WD 22 and the host computer 24. In providing the service to the user, the client application 92 may receive request data from the host application 50 and provide user data in response to the request data. The OTT connection 52 may transfer both the request data and the user data. The client application 92 may interact with the user to generate the user data that it provides.

The processing circuitry 84 may be configured to control any of the methods and/or processes described herein and/or to cause such methods, and/or processes to be performed, e.g., by WD 22. The processor 86 corresponds to one or more processors 86 for performing WD 22 functions described herein. The WD 22 includes memory 88 that is configured to store data, programmatic software code and/or other information described herein. In some embodiments, the software 90 and/or the client application 92 may include instructions that, when executed by the processor 86 and/or processing circuitry 84, causes the processor 86 and/or processing circuitry 84 to perform the processes described herein with respect to WD 22. For example, the processing circuitry 84 of the wireless device 22 may include a signal processing chain unit 34. The signal processing chain unit 34 may be and/or may be located at and/or implemented in at least one processor (e.g., processor 86) in communication with memory 88, the at least one processor 86 configured with machine instructions to perform one of rate de-matching and rate matching a sequence of bits for a code block associated with a wireless communication by at least iteratively processing bits of the sequence of bits, and for each iteration, before processing the bits, pre-calculate a starting position value and a bit processing number, the starting position value representing a starting bit of the bits to be processed in the respective iteration, and the bit processing number representing a total number of bits to be processed in the respective iteration.

In some embodiments, if the one of the rate de-matching and the rate matching is rate de-matching, the sequence of bits includes encoded soft bits. In some embodiments, if the one of the rate de-matching and the rate matching is rate matching, the sequence of bits includes encoded bits. In some embodiments, the at least one processor 86 is further configured with machine instructions to perform the one of the rate de-matching and the rate matching without performing any division operations. In some embodiments, the at least one processor 86 is further configured with machine instructions to perform the one of the rate de-matching and the rate matching without performing any modulus operations. In some embodiments, the pre-calculation of the starting position value and the bit processing number for each of iteration allows the at least one processor 86 to perform the one of the rate de-matching and the rate matching without performing any division operations. In some embodiments, the one of the rate de-matching and the rate matching is performed in at least one of a low density parity check, LDPC, processing chain and a polar processing chain. In some embodiments, the at least one processor 86 is further configured to iteratively process the bits of the sequence of bits by being configured to, for the rate matching, at least one of repeating and puncturing the bits to match a total number of bits associated with resources assigned for the wireless communication; and for the rate de-matching, combining the bits to produce a rate de-matched soft bit sequence. In some embodiments, the at least one processor 86 is further configured with machine instructions to pre-calculate the starting position value and the bit processing number based at least in part on: a length of the code block, a total number of bits to be processed for the one of rate de-matching and rate matching the sequence of bits for the code block, and a start position of a circular buffer, the start position being determined at least in part by a redundancy version of the wireless communication. In some embodiments, the at least one processor 86 is further configured with machine instructions to pre-calculate the starting position value and the bit processing number by being configured to determine the bit processing number based at least in part on: the starting position value of the respective iteration, a length of the code block, a total number of bits to be processed for the one of rate de-matching and rate matching the sequence of bits for the code block, an a start position of a circular buffer, the start position being determined at least in part by a redundancy version of the wireless communication.

In some embodiments, the embodiments herein described as being implemented by the WD 22, in combination with processor 86 and memory 88 of the WD 22 may be implemented by the network node 16 for rate matching and rate de-matching by the processor 70 and memory 72 at the network node 16.

In some embodiments, the inner workings of the network node 16, WD 22, and host computer 24 may be as shown in FIG. 3 and independently, the surrounding network topology may be that of FIG. 2.

In FIG. 3, the OTT connection 52 has been drawn abstractly to illustrate the communication between the host computer 24 and the wireless device 22 via the network node 16, without explicit reference to any intermediary devices and the precise routing of messages via these devices. Network infrastructure may determine the routing, which it may be configured to hide from the WD 22 or from the service provider operating the host computer 24, or both. While the OTT connection 52 is active, the network infrastructure may further take decisions by which it dynamically changes the routing (e.g., on the basis of load balancing consideration or reconfiguration of the network).

The wireless connection 64 between the WD 22 and the network node 16 is in accordance with the teachings of the embodiments described throughout this disclosure. One or more of the various embodiments improve the performance of OTT services provided to the WD 22 using the OTT connection 52, in which the wireless connection 64 may form the last segment. More precisely, the teachings of some of these embodiments may improve the data rate, latency, and/or power consumption and thereby provide benefits such as reduced user waiting time, relaxed restriction on file size, better responsiveness, extended battery lifetime, etc.

In some embodiments, a measurement procedure may be provided for the purpose of monitoring data rate, latency and other factors on which the one or more embodiments improve. There may further be an optional network functionality for reconfiguring the OTT connection 52 between the host computer 24 and WD 22, in response to variations in the measurement results.

The measurement procedure and/or the network functionality for reconfiguring the OTT connection 52 may be implemented in the software 48 of the host computer 24 or in the software 90 of the WD 22, or both. In embodiments, sensors (not shown) may be deployed in or in association with communication devices through which the OTT connection 52 passes; the sensors may participate in the measurement procedure by supplying values of the monitored quantities exemplified above, or supplying values of other physical quantities from which software 48, 90 may compute or estimate the monitored quantities. The reconfiguring of the OTT connection 52 may include message format, retransmission settings, preferred routing etc.; the reconfiguring need not affect the network node 16, and it may be unknown or imperceptible to the network node 16. Some such procedures and functionalities may be known and practiced in the art. In certain embodiments, measurements may involve proprietary WD signaling facilitating the host computer's 24 measurements of throughput, propagation times, latency and the like. In some embodiments, the measurements may be implemented in that the software 48, 90 causes messages to be transmitted, in particular empty or 'dummy' messages, using the OTT connection 52 while it monitors propagation times, errors etc.

Thus, in some embodiments, the host computer 24 includes processing circuitry 42 configured to provide user data and a communication interface 40 that is configured to forward the user data to a cellular network for transmission to the WD 22. In some embodiments, the cellular network also includes the network node 16 with a radio interface 62. In some embodiments, the network node 16 is configured to, and/or the network node's 16 processing circuitry 68 is configured to perform the functions and/or methods described herein for preparing/initiating/maintaining/supporting/ending a transmission to the WD 22, and/or preparing/terminating/maintaining/supporting/ending in receipt of a transmission from the WD 22.

In some embodiments, the host computer 24 includes processing circuitry 42 and a communication interface 40 that is configured to a communication interface 40 configured to receive user data originating from a transmission from a WD 22 to a network node 16. In some embodiments, the WD 22 is configured to, and/or comprises a radio interface 82 and/or processing circuitry 84 configured to perform the functions and/or methods described herein for preparing/initiating/maintaining/supporting/ending a transmission to the network node 16, and/or preparing/terminating/maintaining/supporting/ending in receipt of a transmission from the network node 16.

Although FIGS. 2 and 3 show various "units" such as communication processing chain unit 32, and signal processing chain unit 34 as being within a respective processor, it is contemplated that these units may be implemented such that a portion of the unit is stored in a corresponding memory within the processing circuitry. In other words, the units may be implemented in hardware or in a combination of hardware and software within the processing circuitry.

Figure 4:
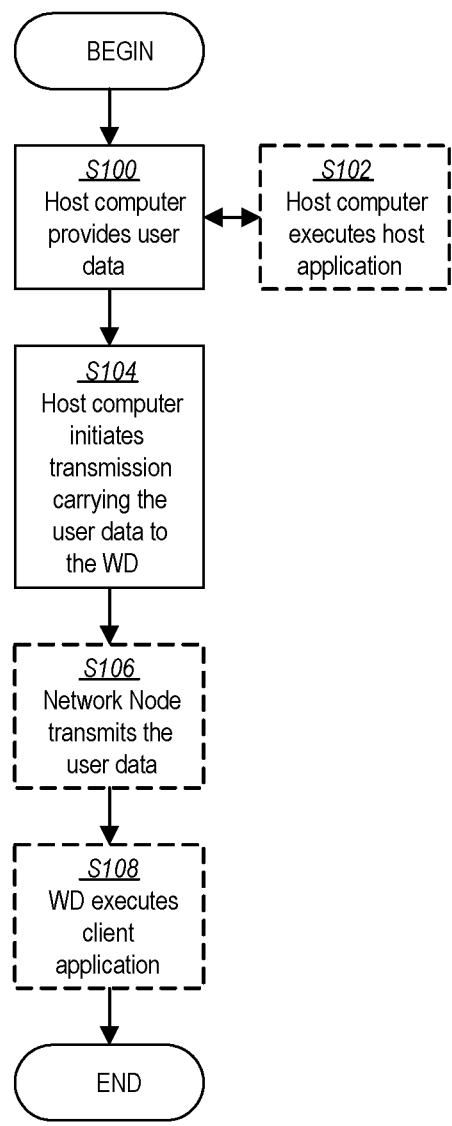
FIG. 4 is a flow chart illustrating exemplary methods implemented in a communication system including a host computer, a network node and a wireless device for executing a client application at a wireless device according to some embodiments of the present disclosure.

FIG. 4 is a flowchart illustrating an exemplary method implemented in a communication system, such as, for example, the communication system of FIGS. 2 and 3, in accordance with one embodiment. The communication system may include a host computer 24, a network node 16 and a WD 22, which may be those described with reference to FIG. 3. In a first step of the method, the host computer 24 provides user data (block S100). In an optional substep of the first step, the host computer 24 provides the user data by executing a host application, such as, for example, the host application 74 (block S102). In a second step, the host computer 24 initiates a transmission carrying the user data to the WD 22 (block S104). In an optional third step, the network node 16 transmits to the WD 22 the user data which was carried in the transmission that the host computer 24 initiated, in accordance with the teachings of the embodiments described throughout this disclosure (block S106). In an optional fourth step, the WD 22 executes a client application, such as, for example, the client application 114, associated with the host application 74 executed by the host computer 24 (block S108).

Figure 5:
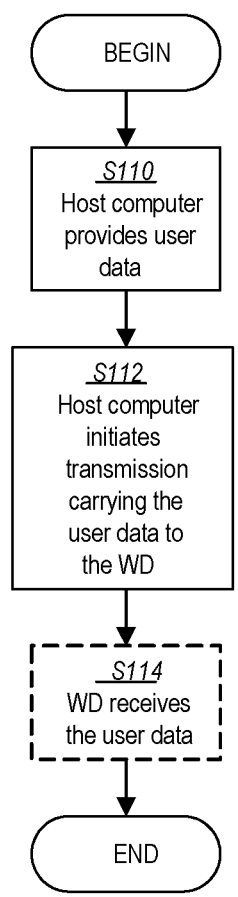
FIG. 5 is a flow chart illustrating exemplary methods implemented in a communication system including a host computer, a network node and a wireless device for receiving user data at a wireless device according to some embodiments of the present disclosure.

FIG. 5 is a flowchart illustrating an exemplary method implemented in a communication system, such as, for example, the communication system of FIG. 2, in accordance with one embodiment. The communication system may include a host computer 24, a network node 16 and a WD 22, which may be those described with reference to FIGS. 2 and 3. In a first step of the method, the host computer 24 provides user data (block S110). In an optional substep (not shown) the host computer 24 provides the user data by executing a host application, such as, for example, the host application 74. In a second step, the host computer 24 initiates a transmission carrying the user data to the WD 22 (block S112). The transmission may pass via the network node 16, in accordance with the teachings of the embodiments described throughout this disclosure. In an optional third step, the WD 22 receives the user data carried in the transmission (block S114).

Figure 6:
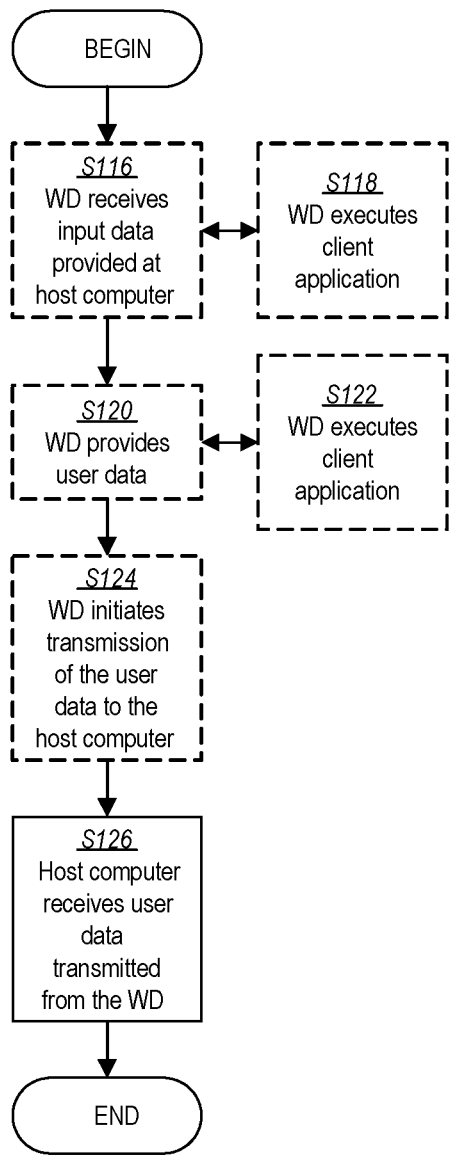
FIG. 6 is a flow chart illustrating exemplary methods implemented in a communication system including a host computer, a network node and a wireless device for receiving user data from the wireless device at a host computer according to some embodiments of the present disclosure.

FIG. 6 is a flowchart illustrating an exemplary method implemented in a communication system, such as, for example, the communication system of FIG. 2, in accordance with one embodiment. The communication system may include a host computer 24, a network node 16 and a WD 22, which may be those described with reference to FIGS. 2 and 3. In an optional first step of the method, the WD 22 receives input data provided by the host computer 24 (block S116). In an optional substep of the first step, the WD 22 executes the client application 114, which provides the user data in reaction to the received input data provided by the host computer 24 (block S118). Additionally or alternatively, in an optional second step, the WD 22 provides user data (block S120). In an optional substep of the second step, the WD provides the user data by executing a client application, such as, for example, client application 114 (block S122). In providing the user data, the executed client application 114 may further consider user input received from the user. Regardless of the specific manner in which the user data was provided, the WD 22 may initiate, in an optional third substep, transmission of the user data to the host computer 24 (block S124). In a fourth step of the method, the host computer 24 receives the user data transmitted from the WD 22, in accordance with the teachings of the embodiments described throughout this disclosure (block S126).

Figure 7:
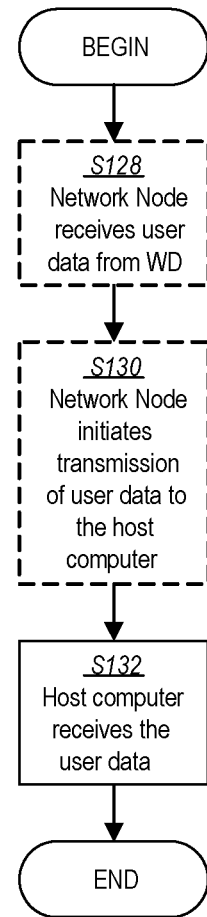
FIG. 7 is a flow chart illustrating exemplary methods implemented in a communication system including a host computer, a network node and a wireless device for receiving user data at a host computer according to some embodiments of the present disclosure.

FIG. 7 is a flowchart illustrating an exemplary method implemented in a communication system, such as, for example, the communication system of FIG. 2, in accordance with one embodiment. The communication system may include a host computer 24, a network node 16 and a WD 22, which may be those described with reference to FIGS. 2 and 3. In an optional first step of the method, in accordance with the teachings of the embodiments described throughout this disclosure, the network node 16 receives user data from the WD 22 (block S128). In an optional second step, the network node 16 initiates transmission of the received user data to the host computer 24 (block S130). In a third step, the host computer 24 receives the user data carried in the transmission initiated by the network node 16 (block S132).

Figure 8:
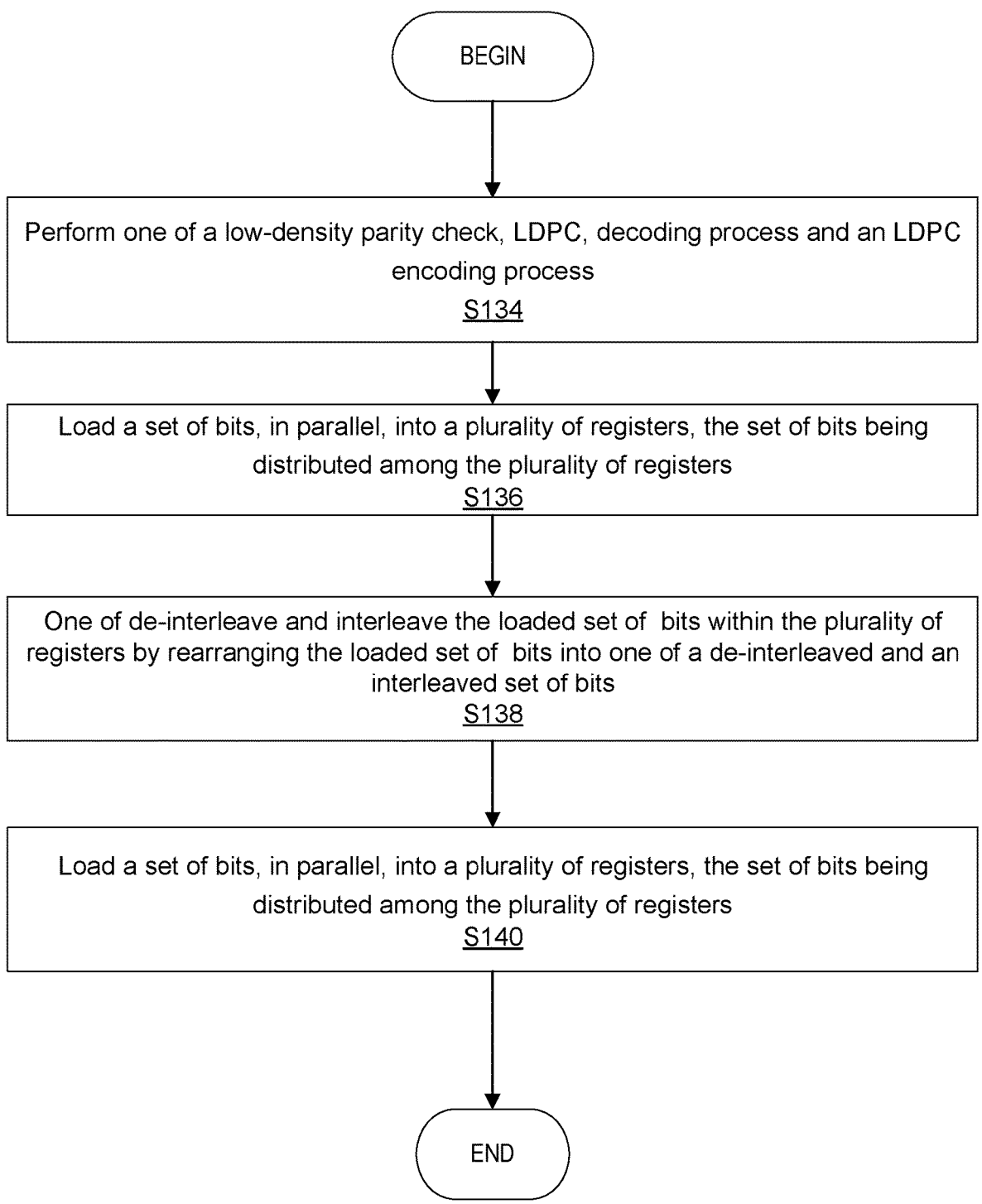
FIG. 8 is a flowchart of an exemplary process in a network node for encoding process chain according to some embodiments of the present disclosure.

FIG. 8 is a flowchart of an exemplary process in a network node 16 for de-interleaving and interleaving according to the techniques provided in this disclosure. The method includes performing (block S134), such as via communication processing chain unit 32, one of a low-density parity check, LDPC, decoding process and an LDPC encoding process. The one of the LDPC decoding process and the LDPC encoding process comprising loading (block S136), such as via communication processing chain unit 32, a set of bits, in parallel, into a plurality of registers, the set of bits being distributed among the plurality of registers. The method includes one of de-interleaving and interleaving (block S138), such as via communication processing chain unit 32, the loaded set of bits within the plurality of registers by rearranging the loaded set of bits into one of a de-interleaved and an interleaved set of bits.

The method includes, after the set of bits is rearranged into the one of the de-interleaved and the interleaved set of bits within the plurality of registers, writing (block S140), such as via communication processing chain unit 32, the one of the de-interleaved and the interleaved set of bits, in parallel, from the plurality of registers to memory 72.

In some embodiments, if the one of the de-interleaving and interleaving is de-interleaving, the set of bits includes a set of encoded soft bits. In some embodiments, if the one of the de-interleaving and interleaving is interleaving, the set of bits includes a set of encoded bits. In some embodiments, each of the plurality of registers is part of processor register architecture of at least one processor 70 performing the one of the LDPC decoding process and the LDPC encoding process; and the memory 72 is external to the at least one processor 70 and separated by the at least one processor 70 via at least one bus. In some embodiments, the one of the de-interleaving and interleaving the set of bits within the plurality of registers further comprises one of de-interleaving and interleaving the set of bits within the plurality of registers by rearranging the set of bits into the one of the de-interleaved and the interleaved set of bits without accessing the memory 72, performing the one of the de-interleaving and the interleaving using the plurality of registers without accessing the memory 72 being faster than performing the one of the de-interleaving and the interleaving using the memory 72. In some embodiments, if the one of the de-interleaving and interleaving is de-interleaving, the set of bits includes a set of soft bits, the set of soft bits corresponding to a plurality of soft values, each of the plurality of soft values corresponding to an LDPC probability value. In some embodiments, the de-interleaving the set of bits within the plurality of registers, such as via communication processing chain unit 32, includes shuffling soft bits in the set of bits; permuting the shuffled soft bits; and performing packing and unpacking on the shuffled, permuted soft bits to produce the de-interleaved set of bits. In some embodiments, the de-interleaving the set of bits within the plurality of registers, such as via communication processing chain unit 32, includes: within each register of the plurality of registers: shuffling soft bits of the set of bits without crossing lanes of the register; and permuting the shuffled soft bits across the lanes of the register; and within the plurality of registers, performing packing and unpacking on the shuffled, permuted soft bits to produce the de-interleaved set of bits without accessing the memory 72. In some embodiments, the interleaving the set of bits within the plurality of registers, such as via communication processing chain unit 32, includes: performing packing and unpacking on bits of the set of bits within the plurality of registers; permuting the packed and unpacked bits within each register of the plurality of registers; and shuffling the permuted, packed and unpacked bits within each register of the plurality of registers to produce the interleaved set of bits without accessing the memory. In some embodiments, the one of the de-interleaved and the interleaved set of bits produced by the rearrangement of the set of bits within the plurality of registers represents a transpose matrix of a matrix associated with the loaded set of bits. In some embodiments, the writing the one of the de-interleaved and the interleaved set of bits, in parallel, from the plurality of registers to the memory 72,such as via communication processing chain unit 32, includes storing the one of the de-interleaved and the interleaved set of bits in the memory 72 at memory addresses determined by at least calculating a base address plus an offset, the offset based at least in part on a rate matching output bit sequence length and a modulation order for a code block of the wireless transmission.

Although the processes above are described with reference to the network node 16, it should be understood that, in some embodiments, such de-interleaving and interleaving processes may be performed by the WD 22, signal processing chain unit 34, processor 86 and/or memory 88 instead.

Figure 9:
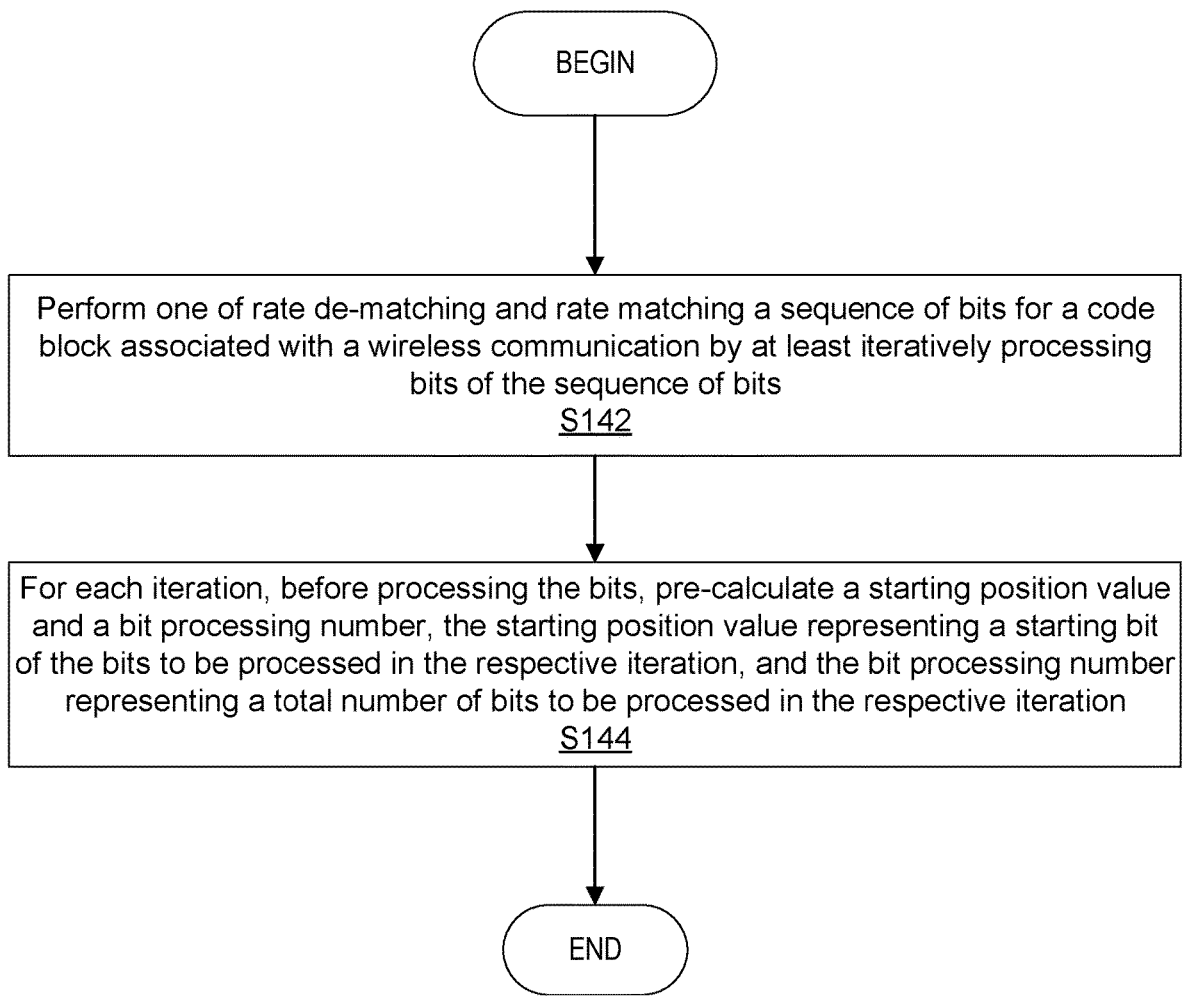
FIG. 9 is a flowchart of an exemplary process in a wireless device for decoding process chain according to some embodiments of the present disclosure.

FIG. 9 is a flowchart of an exemplary process in a wireless device 22 according to some embodiments of the present disclosure. The method includes performing (block S142), such as via signal processing chain unit 34, one of rate de-matching and rate matching a sequence of bits for a code block associated with a wireless communication by at least iteratively processing bits of the sequence of bits. The method includes, for each iteration, before processing the bits, pre-calculating (block S144), such as via signal processing chain unit 34, a starting position value and a bit processing number, the starting position value representing a starting bit of the bits to be processed in the respective iteration, and the bit processing number representing a total number of bits to be processed in the respective iteration.

In some embodiments, if the one of the rate de-matching and the rate matching is rate de-matching, the sequence of bits includes encoded soft bits. In some embodiments, if the one of the rate de-matching and the rate matching is rate matching, the sequence of bits includes encoded bits. In some embodiments, the one of the rate de-matching and rate matching is performed by at least one processor 86 of the communication device (e.g., WD 22) without performing any division operations. In some embodiments, the one of the rate de-matching and rate matching is performed by at least one processor 86, such as via signal processing chain unit 34, of the communication device (e.g., WD 22) without performing any modulus operations. In some embodiments, the pre-calculation of the starting position value and the bit processing number for each of iteration allows the at least one processor 86 to perform the one of the rate de-matching and rate matching without performing any division operations. In some embodiments, the one of the rate de-matching and rate matching is performed in at least one of a low density parity check, LDPC, processing chain and a polar processing chain. In some embodiments, for the rate matching, the iteratively processing the bits of the sequence of bits comprises at least one of repeating and puncturing the bits to match a total number of bits associated with resources assigned for the wireless communication; and for the rate de-matching, the iteratively processing the bits of the sequence of bits comprises combining the bits to produce a rate de-matched soft bit sequence. In some embodiments, the pre-calculating, such as via signal processing chain unit 34, the starting position value and the bit processing number is based at least in part on: a length of the code block, a total number of bits to be processed for the one of rate de-matching and rate matching the sequence of bits for the code block, and a start position of a circular buffer, the start position being determined at least in part by a redundancy version of the wireless communication. In some embodiments, the pre-calculating, such as via signal processing chain unit 34, the starting position value and the bit processing number comprises determining the bit processing number based at least in part on: the starting position value of the respective iteration, a length of the code block, a total number of bits to be processed for the one of rate de-matching and rate matching the sequence of bits for the code block, and a start position of a circular buffer, the start position being determined at least in part by a redundancy version of the wireless communication.

Although the processes above are described with reference to the WD 22, it should be understood that, in some embodiments, such rate de-matching and rate matching processes may be performed by the network node 16, communication processing chain unit 32, processor 70 and/or memory 72 instead.

Having generally described some embodiments for de-interleaving/interleaving and rate de-matching/matching, a more detailed description of some of the embodiments is described below.

Before describing such details, it may be considered that, in some embodiments, for a decoder and de-interleaver (receiver side), the example processing may be performed on soft bits. On the other hand, in some embodiments, for the encoder (transmitter side), the example processing may be performed on bits (not soft bits) and, for the interleaver (transmitter side), the processing may be performed on encoded bits (but not soft bits). In some embodiments, the receiver side (decoder, de-interleaver, and rate dematcher) is performing processing on encoded soft bits; while the transmitter side (encoder, interleaver, rate matcher) is performing processing on bits or encoded bits (but not soft bits). Stated another way, on transmitter side, the processing sequence according to some embodiments of this disclosure, which may be performed by the communication processing chain unit 32, includes bits (e.g., bits in a code block) input into an encoder; rate matching being performed on the encoded bits, and then interleaving being performed on the encoded and rate-matched bits (see e.g., FIG. 1). On the receiver side, the processing sequence according to some embodiments of this disclosure, which may be performed by the signal processing chain unit 34, can include Log-likelihood ratio (LLR) demapped soft bits being de-interleaved, then rate de-matched, and then decoded (e.g., to produce the bits of the code block). The LLR demapped soft bits may be considered bits representing probability values/soft values, such as, for example LDPC probability values.

De-interleaving and Interleaving

Some embodiments for de-interleaving/interleaving, which may be performed by the communication processing chain unit 32 and/or the signal processing chain unit 34, are described below.

De-interleaving in an LDPC Decoding Process Chain

De-interleaving can be performed according to the pseudo code below, where E may denote a total number of "soft" bits received for a code block (CB), Q may denote the modulation order, and the operation may de-interleave bit sequence $f_0, f_1, f_2, \ldots, f_{E-1}$ to bit sequence $e_0, e_1, e_2, \ldots, e_{E-1}$.

```
int m =0;
for (i=0; i<E/Q; i++) {
    for(j=0; j<Q; j++) {
        k = j*(E/Q) + i;
        f[k] = e[m++]; }    }
```

The de-interleaving may include de-interleaving a set of encoded soft bits. The set of encoded soft bits to be de-interleaved may correspond to the bit sequence $f_0, f_1, f_2, \ldots, f_{E-1}$ and the bit sequence $e_0, e_1, e_2, \ldots, e_{E-1}$ may denote the output bit sequence of the de-interleaving. The de-interleaving may be performed at a receiver (e.g., in DL), such as, the WD 22 and/or the signal processing chain unit 34.

In some embodiments of this disclosure, the above operation associated with the pseudo code can be performed in parallel by using, for example, processors, such as the processor 86. In the following discussion, an example processor (e.g., processor 86 at the WD 22) may include eight (8) registers and each register may hold 512 bits or soft bits. In such embodiments, the register may be able to process at least 16 soft values according to the techniques described in this disclosure. In some embodiments, the register may be able to process more than 16 soft values. In other embodiments, processors with a different register architecture arrangement may be used to perform the techniques in this disclosure. In the example process and example processor, the following steps may be performed by the processor (processor 86 at the WD 22) for deinterleaving according to some embodiments of this disclosure: 1) loading bits corresponding to soft values in parallel into the processor registers; 2) shuffling the soft values per lane; 3) permuting per register; 4) unpacking and packing; and 5) storing/writing the result in parallel, as described in more detail below.

Load Soft Values in Parallel for the Registers

In this example, we assume eight (8) registers in the processor (e.g., processor 86) can be used for performing deinterleaving in parallel. The first step may be to load soft values (each soft value may be represented by 8 bits in this example) into the registers in parallel. The start addresses for registers 0, 1, 2, . . . , and 7 are indicated in the table below (Table 2) as addresses 0, 64, 128, . . . , 448, respectively.

TABLE 2

Eight registers loaded with 512 soft values, where each soft value may be represented by 8 bits (binary digits).

| Register 0 | 0 | 1 | 2 | 3 | 4 | 5 | 6 | 7 | 8 | 9 | 10 | 11 | 12 | . . . | 62 | 63 |
|---|---|---|---|---|---|---|---|---|---|---|---|---|---|---|---|---|
| Register 1 | 64 | 65 | 66 | 67 | 68 | 69 | 70 | 71 | 72 | 73 | 74 | 75 | 76 | . . . | 126 | 127 |
| Register 2 | 128 | 129 | 130 | 131 | 132 | 133 | 134 | 135 | 136 | 137 | 138 | 139 | 140 | . . . | 142 | 191 |
| Register 3 | 192 | 193 | 194 | 195 | 196 | 197 | 198 | 199 | 200 | 201 | 202 | 203 | 204 | . . . | 158 | 255 |
| Register 4 | 256 | 257 | 258 | 259 | 260 | 261 | 262 | 263 | 264 | 265 | 266 | 267 | 268 | . . . | 174 | 319 |
| Register 5 | 320 | 321 | 322 | 323 | 324 | 325 | 326 | 327 | 328 | 329 | 330 | 331 | 332 | . . . | 190 | 383 |

TABLE 2-continued

Eight registers loaded with 512 soft values, where each soft value may be represented by 8 bits (binary digits).

| Register 6 | 384 | 385 | 386 | 387 | 388 | 389 | 390 | 391 | 392 | 393 | 394 | 395 | 396 | ... | 206 | 447 |
| Register 7 | 448 | 449 | 450 | 451 | 452 | 453 | 454 | 455 | 456 | 457 | 458 | 459 | 460 | ... | 222 | 511 |

Shuffle Soft Values Per Lane

Figures 10, 11:
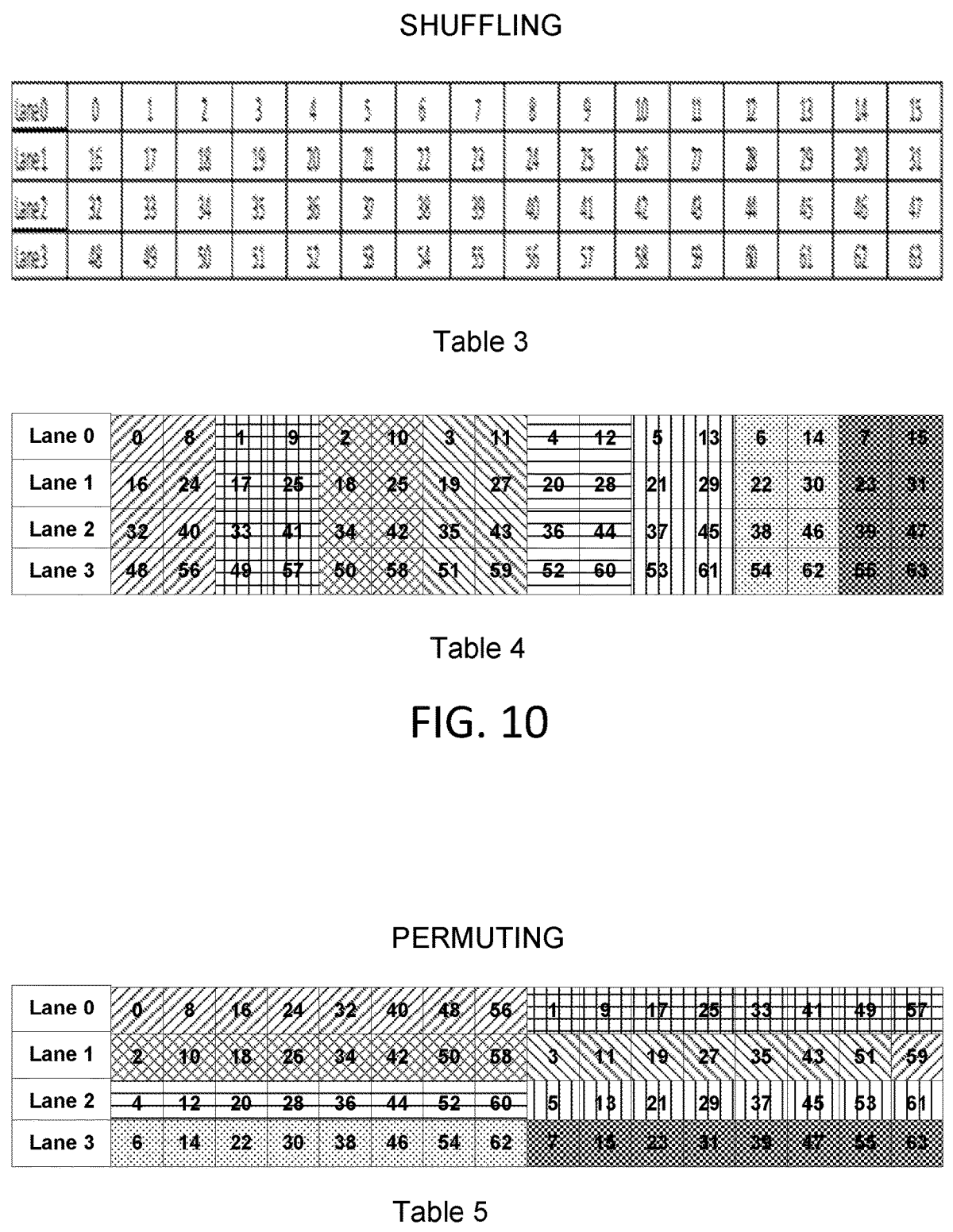

After the soft values are loaded in parallel into the registers, the soft values may be shuffled per lane. In this example, each register includes 4 lanes, and each lane may be able to hold 16 soft values, as shown in the tables depicted in FIG. 10, Tables 3 and 4. It should be understood that the number of lanes may vary according to the particular hardware design. Furthermore, the registers may be considered to be organized into lanes. That said, for this example, assuming the modulation order is 8 (256 QAM modulation), for each lane in each register, soft values' shuffling may be performed, such as, via the signal processing chain unit 34. Table 3 shows an example of the soft values before shuffling for register 0, and Table 4 shows the shuffling result for register 0 according to the techniques in this disclosure. Table 3 shows the soft values before shuffling for register 0, while Table 4 shows the soft values' shuffling results for register 0 (assuming modulation order Q equals 8).

Table 4 illustrates shuffled soft values' groups with shading. As can be seen by a comparison of Table 3 and Table 4 in FIG. 10, the shuffling per lane may result in a rearrangement of register columns in an alternating manner. For example, the column with register address 8 (see Table 3) is shuffled between the first column (with register address 0) and the second column (with register address 1). Columns in the second half of register 0 may be interleaved with the columns in the first half of register 0 in an alternating manner, with the result shown in Table 4. In some embodiments, the shuffling per lane is performed without bits in the lanes crossing over from one lane to a different lane. Tables 3 and 4 illustrate the shuffling being performed in register 0 as an example. The other registers, registers 1-7, may also be shuffled per lane in a similar manner.

In some embodiments, the shuffling may be executed or performed responsive to register shuffle instructions to shuffle contents of the registers according to the techniques disclosed herein. In some embodiments, the shuffle instructions may be part of a set of machine instructions supported by the processor (e.g., processor 86) architecture.

Permuting Per Register

For de-interleaving, after the register contents are shuffled per lane, as described above, the processor (e.g., processor 86), such as via the signal processing chain unit 34, may perform permuting across lanes. The result of the example permuting performed within register 0, as an example, is shown in a table in FIG. 11, Table 5. Table 5 shows the soft values for register 0 after permuting across 4 lanes.

As can be seen by a comparison of Table 4 and Table 5, the permuting/permutation may be performed by arranging and/or re-arranging, within the respective register, the soft values into a different order or sequence, which may be a predetermined order or predetermined sequence, according to the techniques disclosed herein. In the example shown in Table 5, the permuting is performed by moving the soft values in each soft value group (shading indicates the grouping) in the register, across lanes where appropriate, such that the soft values in the respective group end up in the same lane of the register. In other embodiments, the permuting may be performed in other ways. Table 5 illustrates the permuting being performed in register 0 as an example. The other registers, registers 1-7, may also be permuted per register in a similar manner.

In some embodiments, the permuting may be executed or performed responsive to register instructions to arrange and/or re-arrange the contents of the registers according to the techniques disclosed herein. In some embodiments, the register instructions may be part of a set of machine instructions supported by the processor (e.g., processor 86) architecture. In some embodiments, the register instructions may include permuting/permutation instructions supported by the processor 86 architecture. In other embodiments, the permuting/permutation may be executed according to other types of machine instructions, such as, for example, a sequence of shift and/or logic operations performed on the register contents.

Unpacking and Packing

After permuting per register, as described above, each lane of a register may have two groups of soft values, with each group having 8 in-order soft values. As used herein, in some embodiments, the term "in-order" may indicate an order that is desired or targeted for the de-interleaving (or interleaving) results. For example, for de-interleaving, a desired output order may be 0, 8, 16, 24 . . . with the index distance between two adjacent soft values being 8. A table in FIG. 12, Table 6, is shown to illustrate such grouping. Table 6 shows the soft value groups' representation for 8 registers.

As can be seen in Table 6, each lane in each register has two groups of soft values (e.g., group B00 and B01), each group being denoted by Bn, where n is a number representing a group number of a group of soft values. For example, "B00" in lane 0 of register 0 indicates a group of soft values indicated in Table 5, as soft values 0, 8, 16, 24, 32, 40, 48, and 56.

For further clarification of the soft value groups resulting from the permuting per register, Table 7 is shown in FIG. 13. Table 7 illustrates the relation between the group name (from Table 6) and its content for register 0, which corresponds to Table 5. In other words, Table 7 is an alternative visual illustration of the results of the permuting per register (described for the step above) shown in Table 5 (FIG. 11), tying in the soft value group numbers for register 0 from Table 6 (FIG. 12). Table 7 (FIG. 13) shows the relation between the group name and its content for register 0.

Having established the relationship between the soft value group name, Bn, and the contents of the register after permuting per register, the unpacking and packing in this step is described in more detail.

The unpacking and packing may include unpacking and packing register contents, represented by Table 6, so that register 0 holds column 0, register 1 holds column 1, . . . , register 7 holds column 7. In some embodiments, this operation may be considered to be (or may be similar to) a transpose of a matrix. In some embodiments, the unpacking and packing may result in a transpose matrix of a matrix associated with the content/bits in the registers. For example, the unpacking and packing may be performed to transpose the matrix representing the arrangement of the soft values/soft bits after the permuting step above. This transpose matrix feature can be observed by a visual comparison of Table 8 (FIG. 14) (showing results of the example unpacking and packing step), with Table 6 above (showing results of the example permuting step). The result of the unpacking and packing in this example is shown in Table 8 from FIG. 14. Table 8 shows the resulting registers' contents after packing and unpacking operations between registers.

Having shown a desired resulting register content for the unpacking and packing step(s) in this example, one example of the unpacking and packing may be executed and/or performed within the register architecture of the processor (e.g., processor 86) is described below.

The 8 registers in this example can be divided into 4 groups:

Group0: Registers 0 and 1
Group1: Registers 2 and 3
Group2 Registers 4 and 5
Group3: Registers 6 and 7

For each group, the unpacking and packing operations may be performed for the de-interleaving process, as shown below for example. In the following, group 0 is used as an example. For group 0, register 0, each byte of register 0 (from Table 5 above) may be denoted according to a table in FIG. 15, Table 9. Table 9 shows register 0 contents after permuting (alternative denotation for the contents of Table 5). Similarly, for group 0, register 1, each byte of register 1 may be denoted as follows in Table 10 (FIG. 15). Table 10 shows the register 1 contents after permuting. After performing the unpacking and packing, the content of register 0 in this example should correspond to Table 11 (FIG. 15). Table 11 shows register 0 contents after unpacking and packing, according to this example embodiment.

After performing the unpacking and packing, the content of register 1 in this example should correspond to Table 12 in FIG. 16 in this example. Table 12 (FIG. 16) shows the register 1 contents after unpacking and packing.

In some embodiments, the unpacking and packing may be executed or performed responsive to register instructions to arrange and/or re-arrange the contents of the registers according to the techniques disclosed herein. In some embodiments, the register instructions may be part of a set of machine instructions supported by the processor (e.g., processor 86) architecture. In some embodiments, the register instructions may include unpacking and packing machine instructions supported by the processor 86 architecture. In other embodiments, the unpacking and packing may be executed according to other types of machine instructions that can be used to re-arrange and/or arrange the register contents according to the techniques in this disclosure.

In some embodiments, after the soft values are loaded in parallel into the registers, the shuffling, the permuting, and the unpacking and packing described above may be performed within the registers without accessing memory, e.g., the memory 86. In some embodiments, by loading the soft values in parallel and performing the interleaving/de-interleaving within the register architecture of the processor (e.g., processor 86 or processor 70), without accessing memory (e.g., memory 86 or memory 72), processing speed for de-interleaving/interleaving can be improved as compared to existing de-interleaving/interleaving techniques in which the soft bits/bits for de-interleaving/interleaving are calculated sequentially. Furthermore, the register architecture is part of the processor and is therefore faster to access than the memory, which is external to the processor. Thus, the de-interleaving/interleaving within the registers without accessing memory according to some embodiments of this disclosure is faster than performing the de-interleaving/interleaving using the memory.

Store the Result in Parallel

After the de-interleaving by loading the soft values into the registers in parallel, shuffling the soft values, permuting the soft values and unpacking and packing according to the techniques described in this disclosure, the resulting register content may be stored/written to memory (e.g., memory 88) in parallel. In the example described herein, Table 8 represents the de-interleaving result, which can be stored in the memory in parallel.

In some embodiments, the start addresses for registers 0, 1, 2, . . . , 7, are baseAddress +0, baseAddress+E/Q, baseAddress+2E/Q, . . . , 7E/Q, respectively.

In some embodiments, after the results of the de-interleaving in this example (e.g., register content after the shuffling, permuting and packing and unpacking) are written into the memory (e.g., memory 88), the start addresses for registers 0, 1, 2, . . . , 7, may be modified as baseAddress+64, baseAddress+E/Q+64, baseAddress+2E/Q+64, . . . , 7E/Q+ 64, respectively. Thus, in some embodiments, writing or storing the results in the memory in parallel may include determining the memory addresses to write to by calculating a base address plus an offset, where the offset may be based at least in part on a rate matching output bit sequence length, E (or a total number of soft bits in the code block) and the modulation order, Q, of the code block.

Other Considerations

In some embodiments, the processes described above (e.g., loading the soft values into the registers in parallel, shuffling the soft values, permuting the soft values and unpacking and packing soft values) may be repeated until the number of left over soft values from the received signal is less than the number of bytes that can be held in the registers, in this example, 512 bytes. In some embodiments, assuming the number of left over soft values can be expressed as, $$M = k1*256 + k2*64 + k3*32 + k4*16 + k5*8,$$

where ki, i=1, 2, 3, 4, 5, is either 0 or 1. For each ki value which is not equal to 0, parallel processing may be performed in a similar manner for the corresponding number of soft values to be de-interleaved.

In some embodiments, the interleaving process is performed as a reverse of the de-interleaving process and/or is performed on encoded bits, rather than soft bits (e.g., since the soft bits may be considered in some embodiment as a demodulation output at the receiver). Having described one example embodiment for de-interleaving according to the techniques in this disclosure, an example of rate de-matching and matching is described below.

Rate De-Matching and Rate Matching

In some embodiments, the rate matching may be considered as a process at a transmitter of repeating the coded/encoded bits if the assigned physical resource elements for the transmission are more than the coded/encoded bits. In some embodiments, the rate de-matching may be considered a process at a receiver of combining the repeated coded/encoded bits to obtain the original coded/encoded bits or rather the soft bits.

For example, if there are 1024 coded bits to be transmitted and the assigned resource elements can accommodate 2048 coded bits, rate matching may include repeating the coded bits to ensure that all the assigned resource elements are used. Thus, in this example, the input would be the 1024 coded bits and the rate matching output would be 2048 coded bits with one repetition. In one example, the pseudo code for rate matching at the transmitter may be as follows:

```
int BitStart = 0;
int j = 0;
while (BitStart < E) {
    int numberOfBitToRepeat = Math.min((Ncb-k0),(E - BitStart));
    // Iteration for bits repeating operation
    for (int i = 0; i <numberOfBitToRepeat; i++) {
        e[j] = d[i + BitStart];
        j++;                                              }
    k0 = 0;
    BitStart += numberOfBitToRepeat;                      }.
```

On the other hand, the rate de-matching includes performing the reverse of the rate matching since it may be considered part of the signal processing for the receiver of the transmitted signal. Rate de-matching may include combining all the repeated coded soft bits to produce the original sequence of the coded soft bits. By using the same example used to describe rate matching, the input to the rate de-matching would be 2048 coded soft bits with one repetition, and the output of the rate de-matching would be 1024 coded soft bits.

In one embodiment, the pseudo code for rate de-matching at the receiver may be as follows:

```
int softStart = 0;
while (softStart < E) {
    int numberOfSoftToCombine = Math.min((Ncb - k0),(E - softStart));
    // Iteration for soft bits combining operation
    for (int i = 0; i < numberOfSoftToCombine; i++) {
        d[i + k0] += e[i + softStart];                    }
    k0 = 0;
    softStart += numberOfSoftToCombine;                   }.
```

Having generally described some embodiments for rate matching and rate de-matching, further embodiments are described below to illustrate the techniques provided in this disclosure for, as examples, an LDPC process chain and a Polar process chain.

LDPC Process Chain

Rate De-Matching in LDPC Decoding Process Chain

In one embodiment for rate de-matching, k0 may denote the start position of the received "soft" bits which may be determined by the redundant/redundancy version, and Ncb may denote the CB length. A total number of "soft" bits for this CB may be denoted by E. To avoid modulo and division operations according to the techniques in this disclosure, before performing soft combining for each iteration, a pre-calculation may be performed to determine the number of soft bits that are to be used for the combining operation. In one example, the pseudo code may be as follows:

numberOfSoftToCombine=min{(Ncb−k0), (E−softStart)}, where softStart is the start position of the soft bits to be combined for each iteration. Its initial value is set to zero prior to the while loop.

The pseudo code for rate de-matching may be as follows:

```
int softStart = 0;
while (softStart < E) {
    int numberOfSoftToCombine = Math.min((Ncb - k0),(E - softStart));
    // Iteration for soft bits combining operation
    for (int i = 0; i < numberOfSoftToCombine; i++) {
        d[i + k0] += e[i + softStart];                    }
    k0 = 0;
    softStart += numberOfSoftToCombine;                   }.
```

As can be seen in the above pseudo-code, advantageously the modulus operation (which requires a division operation) can be eliminated (as compared to the pseudo-code described above in the section with the heading "Bit Selection").

In some embodiments, the start position, softStart, and the number of soft bits to be combined, numberOfSoftToCombine, for each iteration can be computed/pre-calculated before the iterative rate de-matching process. As a result, the above pseudo code can be implemented in parallel with a processor (e.g., processor 86).

Rate Matching in LDPC Coding Process Chain

In one embodiment, the pseudo code for rate matching according to the techniques in this disclosure may be as follows:

```
int BitStart = 0;
int j = 0;
while (BitStart < E) {
    int numberOfBitToRepeat = Math.min((Ncb-k0),(E - BitStart));
    // Iteration for bits repeating operation
    for (int i = 0; i < numberOfBitToRepeat; i++) {
        e[j] = d[i + BitStart];
        j++;                                              }
    k0 = 0
    BitStart += numberOfBitToRepeat;                      }.
```

The rate matching may be performed by the transmission device, such as, for example, the processor 70 of the network node 16 for a DL communication.

Polar Process Chain

In some embodiments, the techniques disclosure herein for rate de-matching and rate matching may be performed in a Polar Decoding process chain, in addition to the LDPC decoding described above. For example, if the total number of raw coded bits, E, is greater than the Polar code block length, N, the pseudo code for generating the rate matching output bit sequence may be as follows:

```
int k = 0;
while(k < E) {
    e[k] = d[k % N];
    k++;    }
```

Similarly, the pseudo code for rate de-matching at the receiver may be as follows as follows:

```
int k =0;
while(k < E) {
    d[k % N]+=e[k];
    k++;    }.
```

Rate De-Matching in Polar Decoding Process Chain

However, to eliminate use of the modulus operation (which generally requires a division operation) the above pseudo code for rate de-matching can instead be implemented according to the techniques in this disclosure, as follows:

```
int softStart = 0;
while (softStart < E) {
    int numberOfSoftToCombine = Math.min(N,(E - softStart));
    // Iteration for soft bits combining operation
    for (int i = 0; i < numberOfSoftToCombine; i++) {
        d[i] += e[i + softStart];             }
    softStart += numberOfSoftToCombine;       }.
```

In one embodiment, to speed-up the process, the start position, softStart, and the number of soft bits to be combined, numberOfSoftToCombine, for each iteration can be computed/pre-calculated before the iterative rate de-matching process. As a result, in some embodiments, the above pseudo code for rate de-matching in a Polar Decoding process chain can be implemented in parallel with the processor (e.g., processor 86).

Rate Matching in Polar Decoding Process Chain

In one embodiment, the pseudo code for rate matching according to the techniques in this disclosure, can be implemented as follows:

```
int BitStart = 0;
int j = 0;
while (BitStart < E) {
    int numberOfBitToRepeat = Math.min(N,(E - BitStart));
    // Iteration for bits repeating operation
    for (int i = 0; i < numberOfBitToRepeat; i++) {
        e[j] = d[i + BitStart];
        j++;                                  }
    BitStart += numberOfBitToRepeat;          }.
```

In some embodiments, the above pseudo code for rate matching in a Polar Decoding process chain can be implemented in parallel with the processor (e.g., processor 70).

As can be seen in the examples provided above, the rate matching and rate de-matching, as well as, the de-interleaving and interleaving can be implemented to advantageously eliminate division and modulus operations and/or to be executed entirely (or at least substantially) within the register architecture such that the calculations can be processed much faster, compared to existing signal processing, which can be particularly beneficial for wireless standards, such as NR, with much shorter slot times, as compared to other standards, such as LTE. The techniques in this disclosure can allow devices, such as WDs 22, to support receiving and processing transmissions in a very fast manner, as compared to existing processing techniques.

As will be appreciated by one of skill in the art, the concepts described herein may be embodied as a method, data processing system, and/or computer program product. Accordingly, the concepts described herein may take the form of an entirely hardware embodiment, an entirely software embodiment or an embodiment combining software and hardware aspects all generally referred to herein as a "circuit" or "module." Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A method for a communication device associated with a wireless transmission, the method comprising:
performing one of a low-density parity check, LDPC, decoding process and an LDPC encoding process, the one of the LDPC decoding process and the LDPC encoding process comprising:
loading a first set of bits, in parallel, into a plurality of registers, the first set of bits being distributed among the plurality of registers;
one of de-interleaving and interleaving the loaded first set of bits within the plurality of registers by rearranging the loaded first set of bits into one of a de-interleaved and an interleaved second set of bits without accessing a memory; and
after the first set of bits is rearranged into the one of the de-interleaved and the interleaved second set of bits within the plurality of registers, writing the one of the de-interleaved and the interleaved second set of bits, in parallel, from the plurality of registers to memory.

2. The method of claim 1, wherein if the one of the de-interleaving and interleaving is de-interleaving, the first set of bits includes a set of encoded soft bits.

3. The method of claim 1, wherein if the one of the de-interleaving and interleaving is interleaving, the first set of bits includes a set of encoded bits.

4. The method of claim 1, wherein:
each of the plurality of registers is part of processor register architecture of at least one processor performing the one of the LDPC decoding process and the LDPC encoding process; and
the memory is external to the at least one processor and separated by the at least one processor via at least one bus.

5. The method of claim 1, wherein performing the one of the de-interleaving and the interleaving using the plurality of registers without accessing the memory is faster than performing the one of the de-interleaving and the interleaving using the memory.

6. The method of claim 1, wherein, if the one of the de-interleaving and interleaving is de-interleaving, the first set of bits includes a set of soft bits, the set of soft bits corresponding to a plurality of soft values, each of the plurality of soft values corresponding to an LDPC probability value.

7. The method of claim 1, wherein the de-interleaving the first set of bits within the plurality of registers comprises:
Shuffling soft bits in the first set of bits;
permuting the shuffled soft bits; and
performing packing and unpacking on the shuffled, permuted soft bits to produce the de-interleaved second set of bits.

8. The method of claim 1, wherein the de-interleaving the first set of bits within the plurality of registers comprises:
within each register of the plurality of registers:
shuffling soft bits of the first set of bits without crossing lanes of the register; and
permuting the shuffled soft bits across the lanes of the register; and within the plurality of registers, performing packing and unpacking on the shuffled, permuted soft bits to produce the de-interleaved second set of bits without accessing the memory.

9. The method of claim 1, wherein the interleaving the first set of bits within the plurality of registers comprises:
performing packing and unpacking on bits of the first set of bits within the plurality of registers;
permuting the packed and unpacked bits within each register of the plurality of registers; and
shuffling the permuted, packed and unpacked bits within each register of the plurality of registers to produce the interleaved second set of bits without accessing the memory.

10. The method of claim 1, wherein the one of the de-interleaved and the interleaved second set of bits produced by the rearrangement of the first set of bits within the plurality of registers represents a transpose matrix of a matrix associated with the loaded first set of bits.

11. The method of claim 1, wherein the writing the one of the de-interleaved and the interleaved second set of bits, in parallel, from the plurality of registers to the memory comprises:
storing the one of the de-interleaved and the interleaved second set of bits in the memory at memory addresses determined by at least calculating a base address plus an offset, the offset based at least in part on a rate matching output bit sequence length and a modulation order for a code block of the wireless transmission.

12. A communication device associated with a wireless transmission, the communication device comprising:
at least one processor having a plurality of registers, the at least one processor in communication with memory, the at least one processor configured to:
perform one of a low-density parity check, LDPC, decoding process and an LDPC encoding process, the one of the LDPC decoding process and the LDPC encoding process comprising:
loading a first set of bits, in parallel, into a plurality of registers, the first set of bits being distributed among the plurality of registers;
one of de-interleaving and interleaving the loaded first set of bits within the plurality of registers by rearranging the loaded first set of bits into one of a de-interleaved and an interleaved second set of bits without accessing the memory; and
after the first set of bits is rearranged into the one of the de-interleaved and the interleaved second set of bits within the plurality of registers, writing the one of the de-interleaved and the interleaved second set of bits, in parallel, from the plurality of registers to memory.

13. The communication device of claim 12, wherein if the one of the de-interleaving and interleaving is de-interleaving, the first set of bits includes a set of encoded soft bits.

14. The communication device of claim 12, wherein if the one of the de-interleaving and interleaving is interleaving, the first set of bits includes a set of encoded bits.

15. The communication device of claim 12, wherein:
each of the plurality of registers is part of processor register architecture of at least one processor performing the one of the LDPC decoding process and the LDPC encoding process; and
the memory is external to the at least one processor and separated by the at least one processor via at least one bus.

16. The communication device of claim 12, wherein, the one of the de-interleaving and the interleaving using the plurality of registers without accessing the memory is faster than the one of the de-interleaving and the interleaving using the memory.

17. The communication device of claim 12, wherein, if the one of the de-interleaving and interleaving is de-interleaving, the first set of bits includes a set of soft bits, the set of soft bits corresponding to a plurality of soft values, each of the plurality of soft values corresponding to an LDPC probability value.

18. The communication device of claim 12, wherein the at least one processor is further configured with machine instructions to de-interleave the first set of bits within the plurality of registers by:
    shuffling soft bits in the first set of bits;
    permuting the shuffled soft bits; and
    performing packing and unpacking on the shuffled, permuted soft bits to produce the de-interleaved second set of bits.

19. The communication device of claim 12, wherein the at least one processor is further configured with machine instructions to de-interleave the first set of bits within the plurality of registers by:
    within each register of the plurality of registers:
    shuffling soft bits of the first set of bits without crossing lanes of the register; and
    permuting the shuffled soft bits across the lanes of the register; and
    within the plurality of registers, performing packing and unpacking on the shuffled, permuted soft bits to produce the de-interleaved second set of bits without accessing the memory.

20. The communication device of claim 12, wherein the at least one processor is further configured with machine instructions to interleave the first set of bits within the plurality of registers by:
    performing packing and unpacking on bits of the first set of bits within the plurality of registers;
    permuting the packed and unpacked bits within each register of the plurality of registers; and
    shuffling the permuted, packed and unpacked bits within each register of the plurality of registers to produce the interleaved second set of bits without accessing the memory.

21. The communication device of claim 12, wherein the one of the de-interleaved and the interleaved second set of bits produced by the rearrangement of the first set of bits within the plurality of registers represents a transpose matrix of a matrix associated with the loaded first set of bits.

22. The communication device of claim 12, wherein the at least one processor is further configured with machine instructions to write the one of the de-interleaved and the interleaved second set of bits, in parallel, from the plurality of registers to the memory by:
    storing the one of the de-interleaved and the interleaved second set of bits in the memory at memory addresses determined by at least calculating a base address plus an offset, the offset based at least in part on a rate matching output bit sequence length and a modulation order for a code block of the wireless transmission.

* * * * *